US009041869B2

(12) United States Patent
Kim et al.

(10) Patent No.: US 9,041,869 B2
(45) Date of Patent: May 26, 2015

(54) SENSOR SUBSTRATE, METHOD OF MANUFACTURING THE SAME AND SENSING DISPLAY PANEL HAVING THE SAME

(71) Applicant: Samsung Display Co., Ltd., Yongin, Gyeonggi-Do (KR)

(72) Inventors: Duk-Sung Kim, Asan-si (KR); Dong-Yoon Kim, Seoul (KR); Ju-Yong Park, Asan-si (KR); Jae-Jin Pyun, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 146 days.

(21) Appl. No.: 13/870,122

(22) Filed: Apr. 25, 2013

(65) Prior Publication Data

US 2014/0070350 A1 Mar. 13, 2014

(30) Foreign Application Priority Data

Sep. 11, 2012 (KR) ........................ 10-2012-0100387

(51) Int. Cl.
| G06F 3/044 | (2006.01) |
| H01L 31/18 | (2006.01) |
| H01L 31/0232 | (2014.01) |
| G06F 1/16 | (2006.01) |
| G02F 1/1333 | (2006.01) |
| G02F 1/1343 | (2006.01) |
| G02F 1/1362 | (2006.01) |
| G06F 3/041 | (2006.01) |

(52) U.S. Cl.
CPC ............ H01L 31/0232 (2013.01); H01L 31/18 (2013.01); G06F 1/169 (2013.01); G02F 1/13338 (2013.01); G02F 1/134363 (2013.01); G02F 1/136286 (2013.01); G06F 3/0412 (2013.01)

(58) Field of Classification Search
CPC ....... G06F 3/044; G06F 3/0412; G06F 1/169; G06F 1/136286; G06F 1/13338; H01L 31/18; H01L 31/0232
USPC ............... 349/12, 115; 345/173, 174; 257/84, 257/432; 324/686; 438/70
See application file for complete search history.

(56) References Cited

U.S. PATENT DOCUMENTS

| 2011/0187671 A1* | 8/2011 | Huang ........................... 345/174 |
| 2011/0199320 A1 | 8/2011 | Cho et al. |
| 2011/0310033 A1* | 12/2011 | Liu et al. ........................ 345/173 |
| 2013/0147730 A1* | 6/2013 | Chien et al. .................... 345/173 |
| 2013/0341651 A1* | 12/2013 | Kim et al. ........................ 257/84 |

(Continued)

FOREIGN PATENT DOCUMENTS

| JP | 2011-170311 A | 9/2011 |
| JP | 2012-027892 A | 2/2012 |

Primary Examiner — Dao H Nguyen
(74) Attorney, Agent, or Firm — Cantor Colburn LLP

(57) ABSTRACT

A sensor substrate includes a blocking pattern disposed on a base substrate, a first electrode disposed on the base substrate and overlapping the blocking pattern, the first electrode including a plurality of first unit parts arranged in a first direction, each of the first unit parts including a plurality of lines connected to each other in a mesh-type arrangement, a color filter layer disposed on the base substrate, a plurality of contact holes defined in the color filter layer and exposing the first unit parts, and a bridge line between and connected to first unit parts adjacent to each other in the first direction, through the contact holes.

33 Claims, 19 Drawing Sheets

(56) References Cited

U.S. PATENT DOCUMENTS

2014/0078104 A1* 3/2014 Lee et al. ............... 345/174
2014/0078420 A1* 3/2014 Liu et al. ................. 349/12
2014/0184940 A1* 7/2014 Ma et al. .................. 349/12
2014/0198268 A1* 7/2014 Sugita et al. ............. 349/12
2014/0313431 A1* 10/2014 Chang et al. ............. 349/12

* cited by examiner

SENSOR SUBSTRATE, METHOD OF MANUFACTURING THE SAME AND SENSING DISPLAY PANEL HAVING THE SAME

This application claims priority to Korean Patent Application No. 10-2012-0100387, filed on Sep. 11, 2012, and all the benefits accruing therefrom under 35 U.S.C. §119, the content of which is hereby incorporated by reference for all purposes as if fully set forth herein.

BACKGROUND

1. Field

Exemplary embodiments of the invention relate to a sensor substrate and a sensing display panel having the sensor substrate. More particularly, exemplary embodiments of the invention relate to a sensor substrate and a sensing display panel having the sensor substrate, which prevents damage thereto from a static electricity 2. Description of the Related Art Generally, a liquid crystal display ("LCD") apparatus has relatively thin thickness, light weight and low power consumption, and thus the LCD apparatus is used in monitors, laptop computers, cellular phones and so on. The LCD apparatus includes an LCD panel displaying images using a light transmittance of a liquid crystal, and a backlight assembly disposed under the LCD panel and providing light to the LCD panel.

The LCD panel includes an array substrate having a signal line, a thin film transistor ("TFT") and a pixel electrode, an opposite substrate facing the array substrate and having a common electrode, and a liquid crystal layer including liquid crystal disposed between the array substrate and the opposite substrate.

Recently, a touch display device including the LCD panel and a touch screen panel ("TSP") coupled with the LCD panel has been developed in order to perform both a display function and a touch sensing function. The TSP has a film-type structure, and touch position data is inputted thereto by a touch or contact of an object such as a finger of a user or another tool.

SUMMARY

One or more exemplary embodiment of the invention provides a sensor substrate capable of reducing or effectively preventing damage thereto by static electricity.

One or more exemplary embodiment of the invention provides a sensing display panel having the sensor substrate.

According to an exemplary embodiment of the invention, there is provided a sensor substrate including: a blocking pattern on a base substrate; a first electrode on the base substrate and overlapping the blocking pattern, and including a plurality of first unit parts arranged in a first direction, each of the first unit parts including a plurality of first lines connected to each other in a mesh-type arrangement; a color filter layer on the base substrate, and a plurality of contact holes defined in the color filter layer, where the contact holes expose the first lines of the first unit parts; and a bridge line between and connected to first unit parts adjacent in the first direction, through the contact holes.

In an exemplary embodiment, the sensor substrate may further include a second electrode on the base substrate and overlapping the blocking pattern, and including a plurality of second unit parts arranged in a second direction crossing the first direction, each of the second unit parts including a plurality of second lines connected to each other in the mesh-type arrangement; and a connection line extended from the second lines and connecting second unit parts adjacent in the second direction to each other.

In an exemplary embodiment, the bridge line may include a transparent conductive layer.

In an exemplary embodiment, the sensor substrate may further include an overcoating layer on the color filter layer, and a plurality of openings defined in the overcoating layer and corresponding to the contact holes defined in the color filter layer, where the bridge line contacts the first unit parts through the contact holes and is on the overcoating layer.

In an exemplary embodiment, the sensor substrate may further include a plurality of pads which receives signals which are provided to the first and second electrodes, where each of the pads includes: a pad electrode including a metal layer; and a capping electrode including the transparent conductive layer.

In an exemplary embodiment, the bridge line may include a metal layer and a transparent conductive layer.

In an exemplary embodiment, the bridge line may contact a lower surface of the color filter layer, which is adjacent to the contact holes.

In an exemplary embodiment, the blocking pattern may define a pixel area on the base substrate, and the color filter layer may include: an island-shaped color pattern on the pixel area; and a dummy color pattern in a spacing area between the first unit parts adjacent in the first direction, where a thickness of the dummy color pattern is less than a thickness of the island-shaped color pattern.

In an exemplary embodiment, the bridge line may contact a lower surface of the dummy color pattern, which is adjacent to the contact holes.

In an exemplary embodiment, the sensor substrate may further include an overcoating layer on the base substrate and covering the color filter layer and the bridge line.

In an exemplary embodiment, the sensor substrate may further include a plurality of pads which receives signals which are provided the first and second electrodes, where each of the pads includes: a pad electrode including the metal layer and a second metal layer; a capping layer covering the pad electrode and including the transparent conductive layer; and an overcoating pattern on the capping electrode, and an opening defined in the overlapping pattern where the opening exposes an upper surface of the capping electrode.

According to an exemplary embodiment of the invention, there is provided a sensor substrate, the sensor substrate including: a blocking pattern on the a base substrate; a first electrode on the base substrate and overlapping the blocking pattern, and including a plurality of first unit parts arranged in a first direction, each of the first unit parts including a plurality of first lines connected to each other in a mesh-type arrangement; a second electrode on the base substrate and overlapping the blocking pattern, and including a plurality of second unit parts arranged in a second direction crossing the first direction, each of the second unit parts including a plurality of second lines connected to each other in the mesh-type arrangement; an insulating layer on the base substrate, and between the first electrode and the second electrode; a color filter layer on the base substrate and the second electrode; and an overcoating layer on the base substrate and the color filter layer, the color filter layer between the overcoating layer and the base substrate.

In an exemplary embodiment, the sensor substrate may further include a plurality of pads which receives signals which are provided the first and second electrodes, where each of the pads includes: a pad electrode including a metal layer: an overcoating pattern on the pad electrode; the insulating layer between the pad electrode and the overcoating pattern; and an opening defined in the overcoating pattern and the insulating layer, where the opening exposes an upper portion of the pad electrode.

According to an exemplary embodiment of the invention, there is provided a method of manufacturing a sensor substrate, the method including: providing a blocking pattern on a base substrate; providing a first electrode on and overlapping the blocking pattern, the first electrode including a plurality of first unit parts arranged in a first direction, each of the first unit parts including a plurality of first lines connected to each other in a mesh-type structure; providing a color filter layer on the base substrate, and a plurality of contact holes defined in the color filter layer, the contact holes exposing the first lines of the first unit parts; and providing a bridge line between and connected to first unit parts adjacent in the first direction, through the contact holes.

In an exemplary embodiment, the providing a first electrode may include: providing a second electrode on and overlapping the blocking pattern, the second electrode including a plurality of second unit parts arranged in a second direction crossing the first direction, each of the second unit parts including a plurality of second lines connected to each other in the mesh-type arrangement, where second unit parts adjacent in the second direction are connected to each other through the second lines extending in the second direction.

In an exemplary embodiment, the bridge line may be formed from a transparent conductive layer.

In an exemplary embodiment, the method may further include providing an overcoating layer on the color filter layer, and a plurality of openings defined in the overcoating layer, where the openings correspond to the contact holes defined in the color filter layer, where the bridge line contacts the first unit parts through the contact holes and is on the overcoating layer.

In an exemplary embodiment, the method may further include forming a plurality of pads which receives signals which are provided to the first and second electrodes, where each of the pads includes a pad electrode formed from a metal layer and a capping electrode formed from the transparent conductive layer.

In an exemplary embodiment, the bridge line may be formed from a metal layer and the transparent conductive layer.

In an exemplary embodiment, the bridge line may contact the first unit parts through the contact holes and contact a lower surface of the color filter layer, which is adjacent to the contact holes.

In an exemplary embodiment, the providing a blocking pattern may define a pixel area on the base substrate; and the providing the color filter layer may include: providing an island-shaped color filter pattern in the pixel area; and providing a dummy color pattern in a spacing area between the first unit parts adjacent in the first direction, where a thickness of the dummy color pattern is less than a thickness of the color filter pattern.

In an exemplary embodiment, the bridge line may contact a lower surface of the dummy color pattern, which is adjacent to the contact holes.

In an exemplary embodiment, the method may further include providing an overcoating layer on the base substrate, and on the color filter layer and the bridge line.

In an exemplary embodiment, the method may further include providing a plurality of pads which receive signals which are provided to the first and second electrodes, where each of the pads includes: a pad electrode formed from the metal layer and a second metal layer, a capping electrode formed from the transparent conductive layer and covering the pad electrode, and an overcoating pattern on the capping electrode, and an opening defined in the overcoating pattern, where the opening exposes an upper surface of the capping electrode.

According to an exemplary embodiment of the invention, there is provided a method of manufacturing a sensor substrate, the method including: providing a blocking pattern on a base substrate; providing a first electrode on the base substrate and overlapping the blocking pattern, the first electrode including a plurality of first unit parts arranged in a first direction, each of the first unit parts including a plurality of first lines connected to each other in a mesh-type arrangement; providing a second electrode on the base substrate and overlapping the blocking pattern, the second electrode including a plurality of second unit parts arranged in a second direction crossing the first direction, each of the second unit parts including a plurality of second lines connected to each other in the mesh-type arrangement; providing an insulating layer on the base substrate, and between the first electrode and the second electrode; providing a color filer layer on the base substrate and on the second electrode; and providing an overcoating layer on the base substrate and on the color filer layer, the color filter layer between the overcoating layer and the base substrate.

In an exemplary embodiment, the method may further include providing a plurality of pads which receives signals which are provided to the first and second electrodes, where each of the pads includes: a pad electrode formed from a metal layer, an overcoating pattern on the pad electrode, the insulating layer between the pad electrode and the overcoating pattern, and an opening defined in the overcoating pattern and the insulating layer, where the opening exposes an upper surface of the pad electrode.

According to an exemplary embodiment of the invention, there is provided a sensing display panel, the sensing display panel including: a sensor substrate including: a blocking pattern on a first substrate, a first electrode on the first substrate and overlapping the blocking pattern, the first electrode including a plurality of first unit parts arranged in a first direction, each of the first unit parts including a plurality of first lines connected to each other in a mesh-type arrangement, a color filter layer on the first substrate, and a plurality of contact holes defined in the color filter layer, where the contact holes expose the first lines of the first unit parts, and a bridge line connecting first unit parts adjacent to each other in the first direction, through the contact holes; and a display substrate including: a switching element on a second substrate opposite to the first substrate, a pixel electrode connected to the switching element, and a common electrode overlapping the pixel electrode.

In an exemplary embodiment, the sensor substrate may further include a second electrode on the first substrate and overlapping the blocking pattern, and including a plurality of second unit parts arranged in a second direction crossing the first direction, each of the second unit parts including a plurality of second lines connected to each other in the mesh-type arrangement; and a connection line extended from the second lines and connecting second unit parts adjacent in the second direction, to each other.

In an exemplary embodiment, the bridge line may include a transparent conductive layer.

In an exemplary embodiment, the sensor substrate may further include an overcoating layer on the color filter layer, and a plurality of openings defined in the overcoating layer, where the openings overlap the contact holes defined in the color filter layer, where the bridge line contacts the first unit parts through the contact holes and is on the overcoating layer.

In an exemplary embodiment, the sensor substrate may further include a plurality of pads which receives signals which are provided to the first and second electrodes, where each of the pads includes: a pad electrode including a metal layer, and a capping electrode including the transparent conductive layer.

In an exemplary embodiment, the bridge line may include a metal layer and a transparent conductive layer.

In an exemplary embodiment, the bridge line may contact a lower surface of the color filter layer, which is adjacent to the contact holes.

In an exemplary embodiment, the blocking pattern may define a pixel area, and the color filter layer may include: an island-shaped color pattern on the pixel area; and a dummy color pattern in a spacing area between the first unit parts adjacent in the first direction, where a thickness of the dummy color pattern is less than a thickness of the island-shaped color pattern.

In an exemplary embodiment, the bridge line may contact a lower surface of the dummy color pattern, which is adjacent to the contact holes.

In an exemplary embodiment, the sensor substrate may further include an overcoating layer on the base substrate, where the color filter layer and the bridge line are between the overcoating layer and the base substrate.

In an exemplary embodiment, the sensor substrate may further include a plurality of pads which receives signals which are provided to the first and second electrodes, where each of the pads includes: a pad electrode including the metal layer and a second metal layer, a capping layer covering the pad electrode and including the transparent conductive layer, and an overcoating pattern on the capping electrode, and an opening defined in the overlapping pattern, where the opening exposes an upper surface of the capping electrode.

According to the invention, processes of manufacturing the sensor substrate may be simplified and a reliability of driving a sensing display panel including the sensor substrate may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
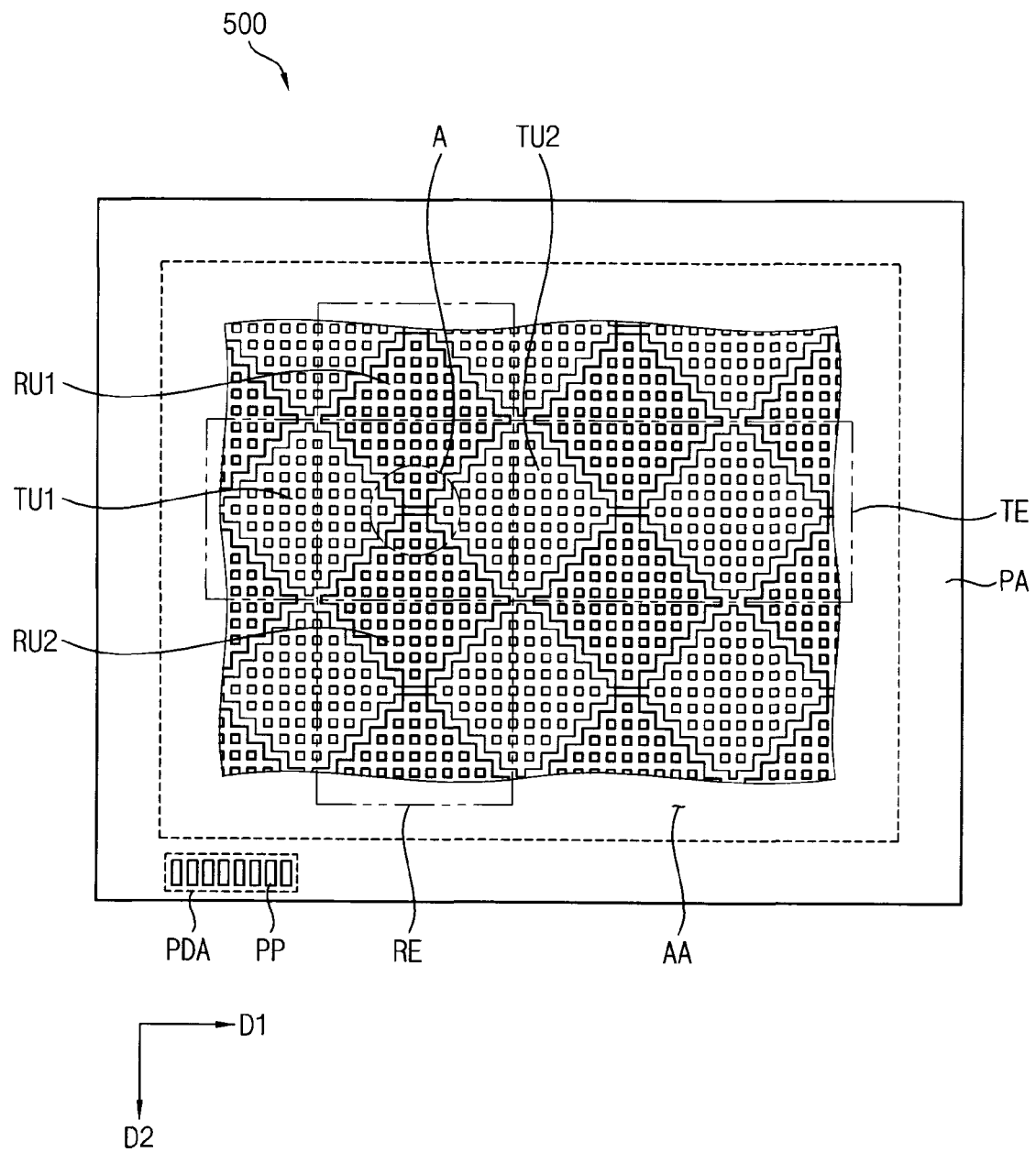
FIG. 1 is a block diagram illustrating an exemplary embodiment of a sensing display panel according to the invention.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In a touch display device including a liquid crystal display ("LCD") panel and a touch screen panel ("TSP") coupled with the LCD panel, the TSP may have a film-type structure. Touch position data is inputted to the film-type TSP by a touch or contact of an object such as a finger of a user or another tool. However, in the touch display device, a light interference is generated in a spacing area between the LCD panel and the film-type TSP so that an efficiency of light utilization undesirably decreases. While an internal touch display device which includes an internal LCD panel having a built-in touch sensor has been developed, there remains a need for an improved touch display device which maximizes light utilization efficiency.

Hereinafter, the invention will be explained in detail with reference to the accompanying drawings.

Figure 2:
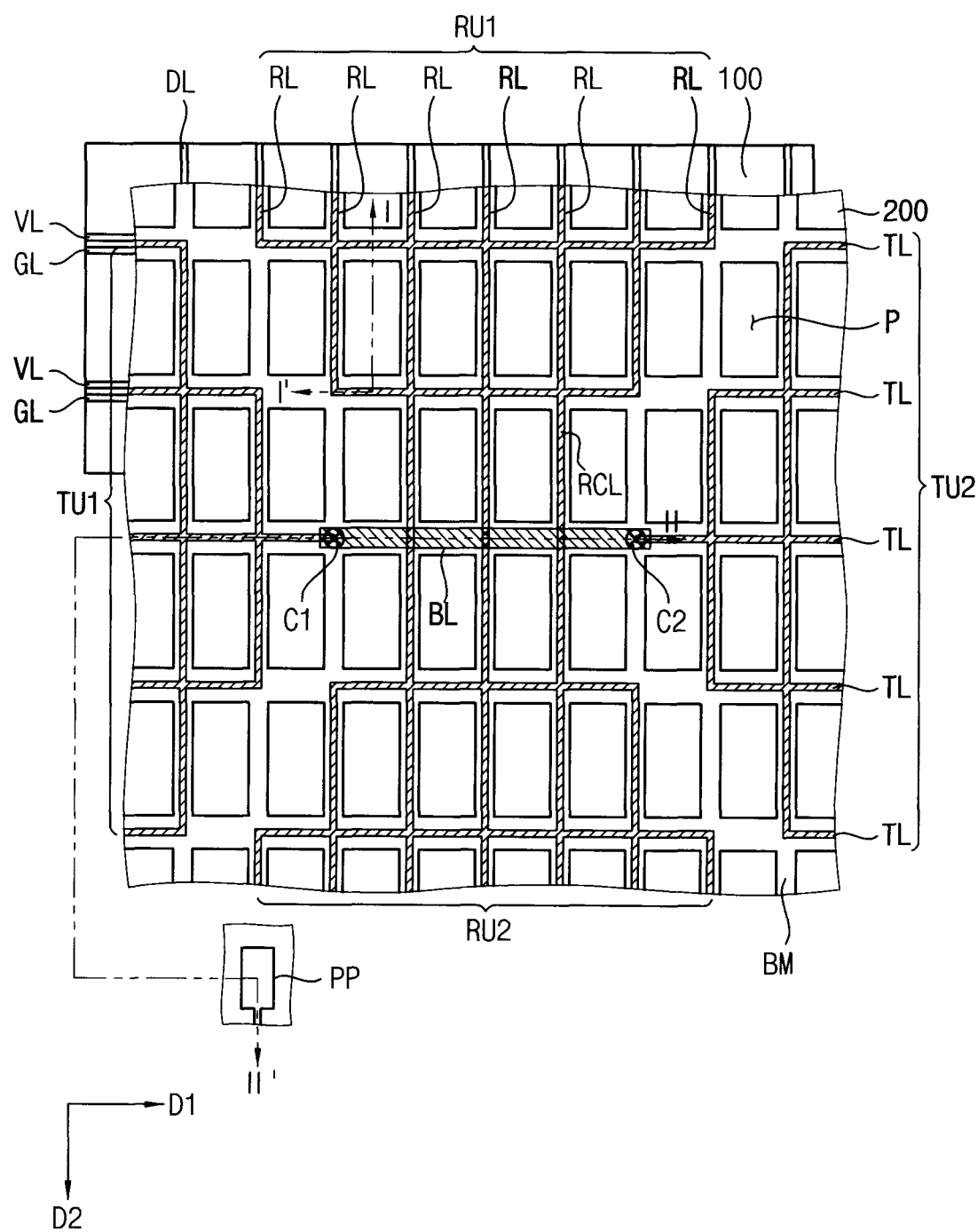
FIG. 2 is an enlarged plan view showing portion "A" of the sensing display panel as shown in FIG. 1.
Figure 3:
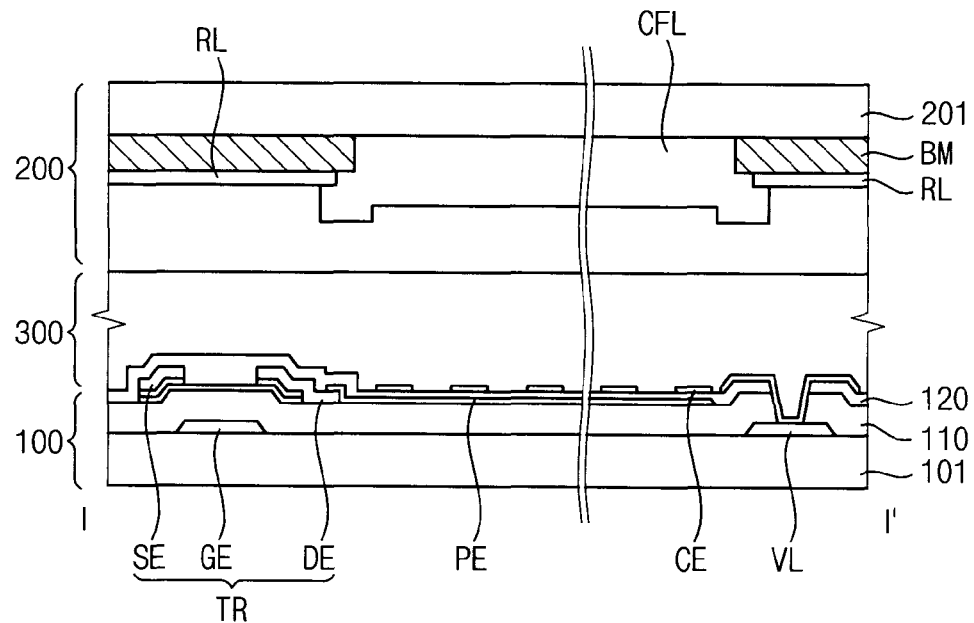
FIG. 3 is a cross-sectional view illustrating the sensing display panel taken along line I-I' as shown in FIG. 2.
Figure 4:
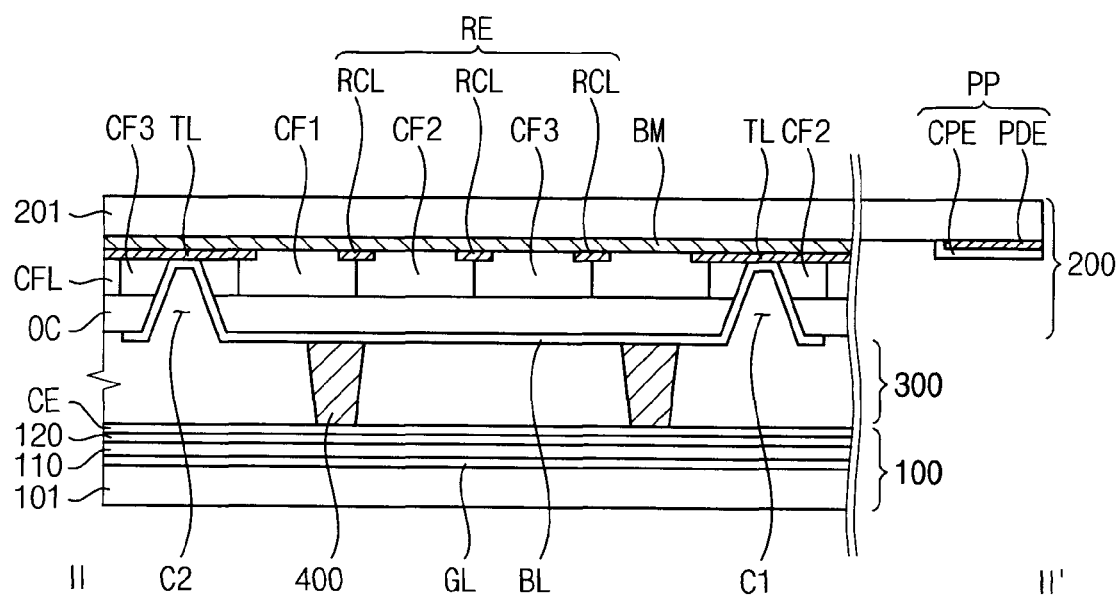
FIG. 4 is a cross-sectional view illustrating the sensing display panel taken along line II-II' as shown in FIG. 2.

FIG. 1 is a block diagram illustrating an exemplary embodiment of a sensing display panel according to the invention. FIG. 2 is an enlarged plan view showing portion "A" of the sensing display panel as shown in FIG. 1. FIG. 3 is a cross-sectional view illustrating the sensing display panel taken along line I-I' as shown in FIG. 2. FIG. 4 is a cross-sectional view illustrating the sensing display panel taken along line II-II' as shown in FIG. 2. The sensing display panel may otherwise be referred to as a capacitive touch screen which senses a touch or contact of an object, and includes a driving line and a sensing line forming a capacitance used in the sensing of the touch or contact.

Referring to FIGS. 1 to 4, the sensing display panel 500 may include an active area AA, and a peripheral area PA surrounding the active area AA. The sensing display panel 500 may include a display substrate 100, a sensor substrate 200, a liquid crystal layer 300 and a column spacer 400. The active area AA is configured to sense a touch or contact of an object, and to display an image. The peripheral area PA includes driving circuits therein which determine the existence of the touch or contact and drive the display panel to display the image.

The display substrate 100 may include a first base substrate 101. The display substrate 100 may include a gate line GL, a common line VL, a data line DL, a switching element TR, a pixel electrode PE and a common electrode CE which are disposed in the active area AA of the first base substrate 101. The display substrate 100 may include a plurality of gate lines GL, a plurality of common lines VL, a plurality of data lines DL, a plurality of switching elements TR, a plurality of pixel electrodes PE and the common electrode CE which are disposed in the active area AA of the first base substrate 101.

The gate line GL has a longitudinal axis which is extended in a first direction D1, and adjacent gate lines GL and arranged in a second direction D2 crossing the first direction D1. The common line VL is adjacent to the gate line GL and is parallel with the gate line GL. The data line DL has a longitudinal axis which is extended in the second direction D2, and adjacent data lines DL and arranged in the first direction D1. The switching element TR includes a gate electrode GE continuous with and connected to the gate line GL, a source electrode SE continuous with and connected to the data line DL, and a drain electrode DE physically and/or electrically connected to the pixel electrode PE.

The pixel electrode PE includes a transparent conductive material and is disposed in a pixel area P of the first base substrate 101. In an exemplary embodiment of forming the sensing display panel 500, the pixel electrode PE may be formed from a transparent conductive layer. The common electrode CE includes a transparent conductive material, is physically and/or electrically connected to a common line VL through a contact hole and overlaps the pixel electrode PE in the pixel area P. The common electrode CE may include one or more slit patterns.

As shown in FIG. 3, the display substrate 100 may further include a gate insulating layer 110 and a protecting layer 120. The gate insulating layer 110 covers a gate pattern which includes the gate electrode GE, the gate line GL and the common line VL. The protecting layer 120 covers a source pattern which includes the data line DL, the source electrode SE and the drain electrode DE.

The sensor substrate 200 may include a second base substrate 201. The sensor substrate 200 may include a blocking pattern BM, a first electrode TE, a second electrode RE, a color filter layer CFL and an overcoating layer OC which are disposed in the active area AA of the second base substrate 201. The sensor substrate 200 may include the blocking pattern BM, a plurality of first electrodes TE, a plurality of second electrodes RE, the color filter layer CFL and the overcoating layer OC which are disposed in the active area AA of the second base substrate 201. The sensor substrate 200 may include one or more pads PP which is disposed in the peripheral area PA of the second base substrate 201. Hereinafter, the first electrodes TE may be referred to as driving electrodes and the second electrodes RE may be referred to as sensing electrodes.

The blocking pattern BM is disposed on the second base substrate 201 and defines a transmission area at which light is transmitted, and a blocking area at which the light is blocked. The transmission area may correspond to the pixel area P.

A plurality of driving electrodes TE has a longitudinal axis which is extended in the first direction D1 and arranged in the second direction D2. Driving signals are sequentially applied to the driving electrodes TE according to a capacitive touch screen.

Each of the driving electrodes TE may include a plurality of driving unit parts TU1 and TU2 arranged in the first direction D1, and a plurality of bridge lines BL connecting the driving unit parts TU1 and TU2 adjacent to each other in the first direction D1. A driving electrode TE may be a group of the driving unit parts TU1 and TU2 arranged in the first direction D1, and a group of bridge lines BL connecting the driving unit parts TU1 and TU2 adjacent to each other in the first direction D1. A driving unit part TU1 and TU2 among the plurality of driving unit parts TU1 and TU2 may have an overall planar diamond shape and may include a plurality of driving lines TL in a mesh-type arrangement. The driving lines TL define spaces between adjacent portions of the driving lines TL. Each of the driving lines TL is disposed in an area in which the blocking pattern BM is disposed and overlaps the light blocking pattern BM. The bridge line BL may include a different metal material from a metal material of the driving line TL, and may have a single-layered structure. In an exemplary embodiment of forming the sensing display panel 500, the bridge line BL may be formed from a different metal layer from a metal layer used for forming the driving line TL, such that the bridge line BL is in a different layer of the sensor substrate 200 than the driving line TL, and may have the single-layered structure.

As described above, the driving unit parts TU1 and TU2 have the overall planar diamond shape, but is not limited thereto. The overall shape of the driving unit parts TU1 and TU2 may be variously designed to improve a touch sensing sensitivity of the sensing display panel 500.

A plurality of sensing electrodes RE has a longitudinal axis which is extended in the second direction D2 and arranged in the first direction D1. Sensing signals are applied to the sensing electrodes TE according to the capacitive touch screen.

Each of the sensing electrodes RE may include a plurality of sensing unit parts RU1 and RU2 arranged in the second direction D2, and a sensing connection line RCL connecting the sensing unit parts RU1 and RU2 adjacent to each other in the second direction D2. A sensing electrode RE may be a group of the sensing unit parts RU1 and RU2 arranged in the second direction D2, and a group of sensing connection lines RCL connecting the sensing unit parts RU1 and RU2 adjacent to each other in the second direction D2. A sensing unit part RU1 and RU2 among the plurality of sensing unit parts RU1 and RU2 may have an overall planar diamond shape and may include a plurality of sensing lines RL in a mesh-type arrangement. The sensing connection line RCL and the sensing lines RL of the sensing unit parts RU1 and RU2 adjacent to each other in the second direction D2 may form a single, unitary, indivisible member.

Each of the sensing lines RL is disposed in an area in which the blocking pattern BM is disposed and overlaps the light blocking pattern BM. The sensing connection line RCL may include a same metal material as that of the sensing line RL. In an exemplary embodiment of forming the sensing display panel 500, the sensing connection line RCL may be formed from a same metal layer as a metal layer used for forming the sensing line RL such that the sensing connection line RCL is in a same layer of the sensor substrate 200 as the sensing line RL.

As described above, the sensing unit parts RU1 and RU2 have the overall planar diamond shape, but is not limited thereto. The overall shape of the sensing unit parts RU1 and RU2 may be variously designed to improve the touch sensing sensitivity of the sensing display panel 500.

The color filter layer CFL may include first color, second color and third color patterns CF1, CF2 and CF3. Each of the first color, second color and third color patterns CF1, CF2 and CF3 has a longitudinal axis which is extended in the second direction D2, and a plurality of the color patterns is arranged in the first direction D1. The first color, second color and third color patterns CF1, CF2 and CF3 may respectively correspond to red, green and blue patterns, but are not limited thereto.

The overcoating layer OC is disposed on the color filter layer CFL. The overcoating layer OC may have a planarized lower surface so as to planarize layers of the sensor substrate 200 and form a substantially flat surface of the sensor substrate 200.

The bridge line BL is between the driving unit parts TU adjacent to each other in the first direction D1 and connects these adjacent driving unit parts TU through first and second contact holes C1 and C2 which are defined in and by the color filter layer CFL and the overcoating layer OC. The bridge line BL includes a transparent conductive material. The transparent conductive material may include a conductive oxide material. The conductive oxide material may include indium tin oxide ("ITO"), indium zinc oxide ("IZO"), amorphous indium tin oxide ("a-ITO") and so on.

In the illustrated exemplary embodiment, the bridge line BL is between and connected to the driving unit parts TU1 and TU2. Alternatively, the bridge line BL may be between and connected to the sensing unit parts RU1 and RU2. That is, the driving unit parts TU1 and TU2 may be connected through a driving connection line which is continuous with and extended from the driving line TL in the first direction D1 and in a same layer as the driving unit parts TU1 and TU2, where adjacent sensing unit parts RU1 and RU2 are connected through the bridge line BL in a different layer of the sensor substrate 200 than the sensing unit parts RU1 and RU2.

The pad PP may include a pad electrode PDE and a capping electrode CPE. The pad electrode PDE may include a same metal material as the metal material of the driving and sensing electrodes TE and RE. In an exemplary embodiment of forming the sensing display panel 500, the pad electrode PDE may be formed from the same metal layer as a metal layer used for forming the driving electrode TE and/or the sensing electrode RE. The capping electrode CPE may include a same transparent conductive material as that of the bridge line BL. In an exemplary embodiment of forming the sensing display panel 500, the capping electrode CPE may be formed from the same transparent conductive layer as the transparent conductive layer used for forming the bridge line BL. The transparent conductive layer may include a conductive oxide material such as ITO, IZO, a-ITO and so on, so that oxidation of the pad electrode PDE may be reduced or effectively prevented. Therefore, a reliability of signals received via the pads PP may be improved.

The liquid crystal layer 300 is disposed between the display substrate 100 and the sensor substrate 200. The liquid crystal layer 300 includes liquid crystal including liquid molecules and the liquid molecules are arranged by an electrical potential difference between the pixel electrode PE and the common electrode CE which are disposed on the display substrate 100. According to the arranged liquid molecules, the sensing display panel 500 may display various grayscales.

The column spacer 400 maintains a gap between the display substrate 100 and the sensor substrate 200. The column spacer 400 may be included in the display substrate 100 and/or the sensor substrate 200.

FIGS. 5A to 5E are cross-sectional views explaining an exemplary embodiment of a manufacturing method of the sensor substrate as shown in FIG. 4.

Figure 5A:
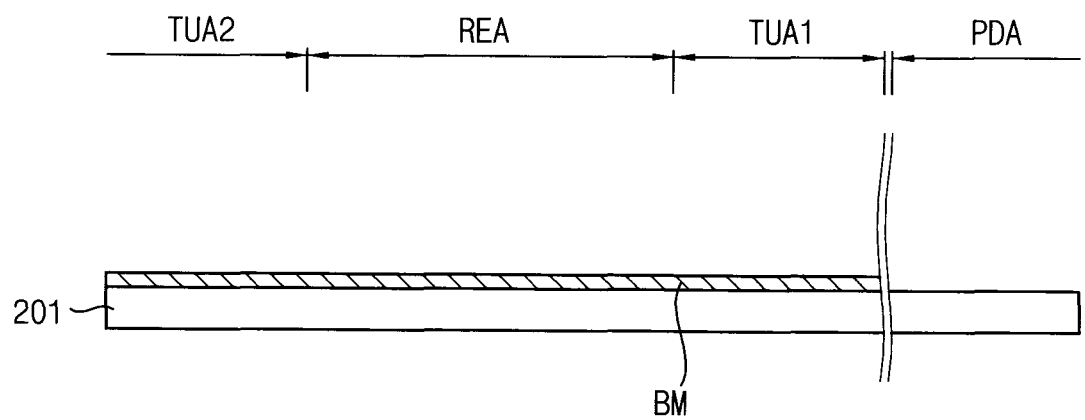
FIGS. 5A to 5E are cross-sectional views explaining an exemplary embodiment of a manufacturing method of a sensor substrate as shown in FIG. 4.

Referring to FIGS. 1, 2 and 5A, a blocking layer is formed (e.g., provided) on a second base substrate 201. The blocking layer BM is patterned to form a blocking pattern BM. The blocking pattern BM is formed in an active area AA of the second base substrate 201. An area in which the blocking pattern BM is formed may be defined as a blocking area, and an area in which the blocking pattern BM is not formed may be defined as a transmission area. The transmission area may correspond to a pixel area P in which a pixel electrode PE is formed. The blocking pattern BM may have a substantially uniform thickness across the sensing display panel 500, but is not limited thereto or thereby, and may have different thicknesses corresponding to different portions of the sensing display panel 500.

Figure 5B:
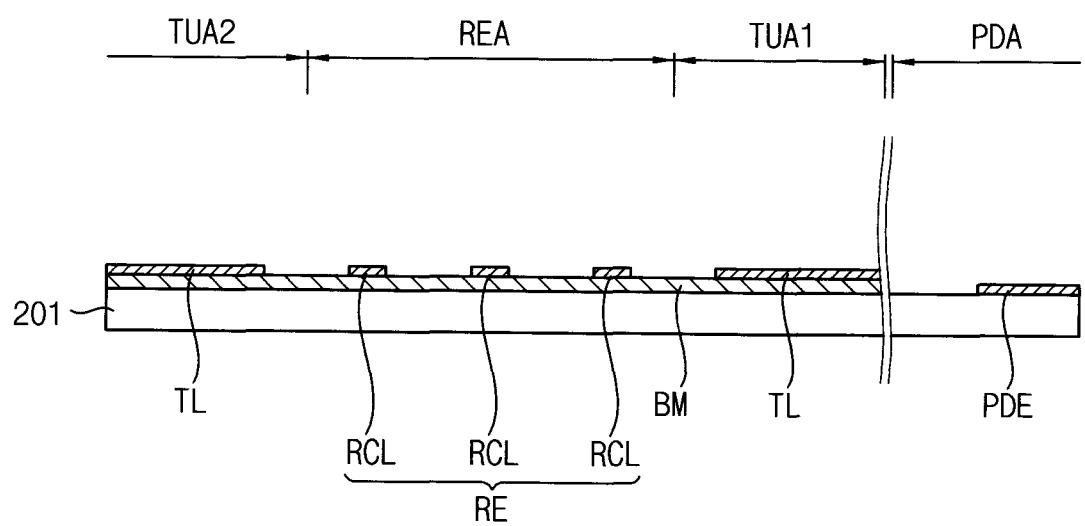

Referring to FIGS. 1, 2 and 5B, a metal layer is formed on the second base substrate 201 including the blocking pattern BM. The metal layer includes a metal such as chromium (Cr), aluminum (Al), tantalum (Ta), molybdenum (Mo), titanium (Ti), tungsten (W), copper (Cu), silver (Ag), etc. or alloy thereof. The metal layer is patterned to form the driving line TL, the sensing line RL and the sensing connection line RCL in the active area AA, and to form the pad electrode PDE in the peripheral area PA. The driving line TL, the sensing line RL, the sensing connection line RCL and the pad electrode PDE may be considered formed from and/or in a same layer of the sensor substrate 200, as the same metal layer is patterned to form these elements.

The mesh-type driving lines TL are formed in an area in which the blocking pattern BM is formed, to form and define the driving unit parts TU1 and TU2. Each of the driving unit parts TU1 and TU2 is spaced apart from different driving unit parts TU, which are adjacent to the driving unit parts TU1 and TU2 in the first and second directions D1 and D2. As shown in FIG. 5B, driving lines TL of a first driving unit part TU1 are formed in a first driving unit area TUA1. Driving lines TL of a second driving unit part TU2 are formed in a second driving unit area TUA2 which is spaced apart from the first driving unit area TUA1 in the first direction D1.

The mesh-type sensing lines RL are formed in an area in which the blocking pattern BM is formed, to form the sensing unit parts RU1 and RU2. The sensing unit parts RU1 and RU2 are connected to different sensing unit parts RU, which are adjacent to the sensing unit parts RU1 and RU2 in the second direction D2, through the sensing connection line RCL. The sensing unit parts RU1 and RU2 are spaced apart from different sensing unit parts RU, which are adjacent to the sensing unit parts RU1 and RU2 in the first direction D1. As shown in FIG. 5B, the sensing connection line RCL is formed in a spacing area that is defined as a sensing electrode area REA between the spaced apart first and second driving unit areas TUA1 and TUA2 adjacent in the first direction D1. The sensing connection line RCL physically and electrically connects the first sensing unit part RU1 and the second sensing unit part RU2 which are arranged adjacent in the second direction D2.

One or more pad PP is disposed in a pad area PDA of the second base substrate 201. The pad electrode PDE of the pad PP is formed in the pad area PDA.

Figure 5C:
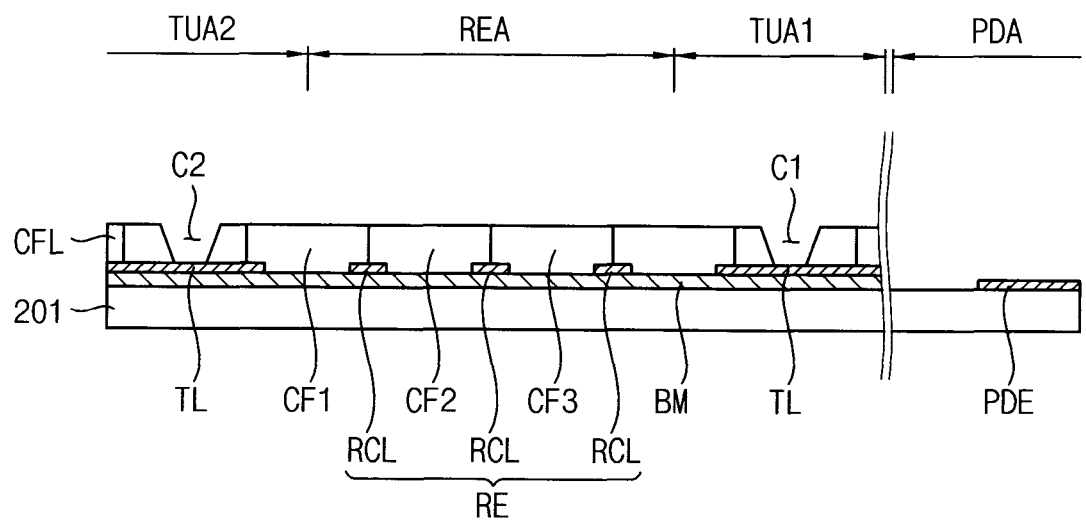

Referring to FIGS. 1, 2 and 5C, a color filter layer CFL is formed on the second base substrate 201 including the driving line TL, the sensing line RL, the sensing connection line RCL and the pad electrode PDE. The first and second contact holes C1 and C2 are formed extending through a thickness of the color filter layer CFL, such that the contact holes C1 and C2 are defined in the color filter layer CFL. The first contact hole C1 exposes the driving line TL of the first driving unit part TU1 and the second contact hole C2 exposes the driving line TL of the second driving unit part TU2. The color filter layer CFL may not be formed in the pad area PDA including the pad electrode PDE.

In one exemplary embodiment, for example, a first color photoresist layer is formed on the second base substrate 201. The first color photoresist layer is patterned using a first color-mask to form a first color pattern CF1 having a longitudinal axis which is extended in the second direction D2. A second color photoresist layer is formed on the second base substrate 201 including the first color pattern CF1. The second color photoresist layer is patterned using a second color-mask to form a second color pattern CF2 having a longitudinal axis parallel with that of the first color pattern CF1. A third color photoresist layer is formed on the second base substrate 201 including the first and second color patterns CF1 and CF2. The third color photoresist layer is patterned using a third color-mask to form a third color pattern CF3 having a longitudinal axis parallel with that of the second color pattern CF2. The second color-mask may include an opening pattern for forming the first contact hole C1 and the third color-mask may include an opening pattern for the second contact hole C2. According to positions of the first and second contact holes C1 and C2, the opening pattern may be included in at least one of the first, second and third color-masks.

As described above, the contact holes C1 and C2 may be defined in the color filter layer CFL using the color-masks.

Figure 5D:
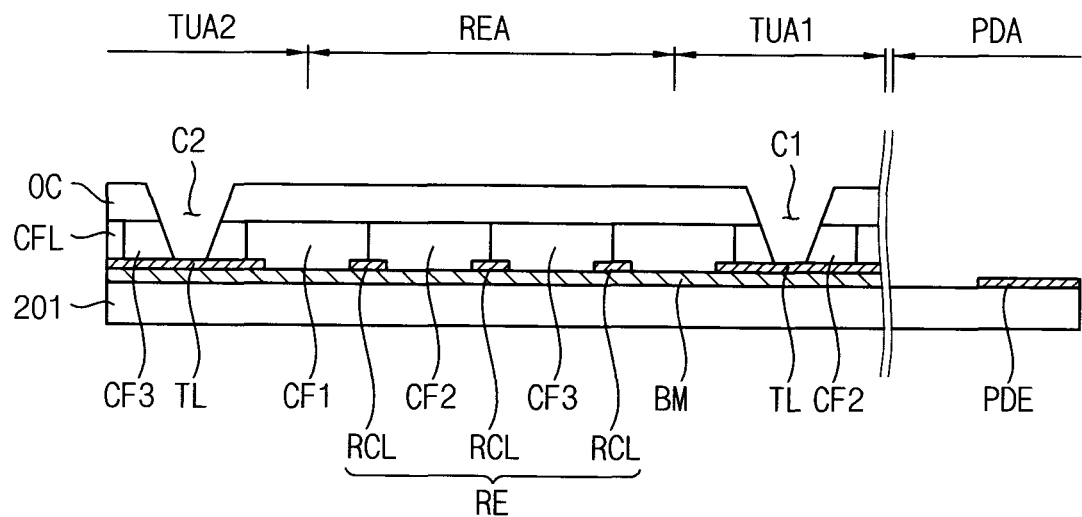

Referring to FIGS. 1, 2 and 5D, an overcoating layer OC is formed on the second base substrate 201 including the color filter layer CFL.

A plurality of openings is defined in the overcoating layer OC and the openings respectively correspond to and may be aligned with the first and second contact holes C1 and C2. The overcoating layer OC is not formed in the pad area PDA including the pad electrode PDE. Thus, the pad electrode PDE may be exposed by the color filter layer CFL and the overcoating layer OC.

Figure 5E:
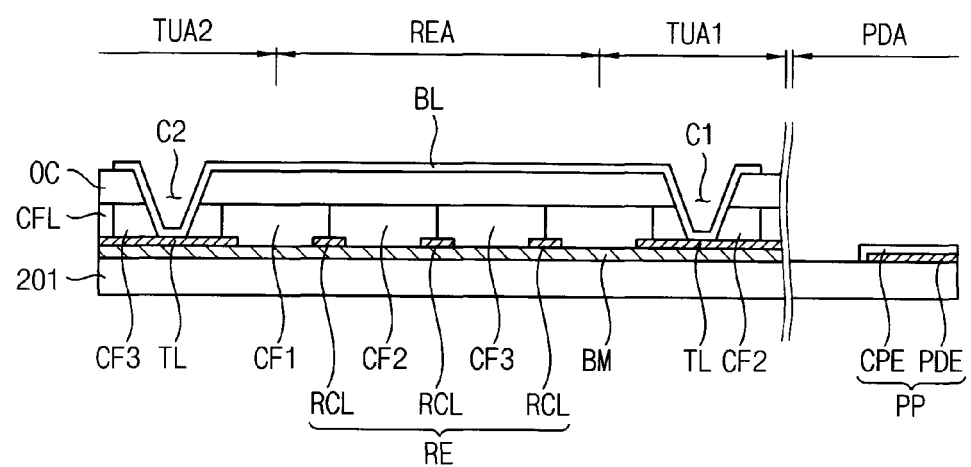

Referring to FIGS. 1, 2 and 5E, a transparent conductive layer is formed on the second base substrate 201 including the overcoating layer OC. The transparent conductive layer include a transparent conductive oxide material, and the transparent conductive oxide material may include ITO, IZO, a-ITO and so on so. The transparent conductive layer is patterned to form the bridge line BL in the active area AA and a capping electrode CPE in the pad area PDA. The bridge line BL and the capping electrode CPE may be considered formed from and/or in a same layer of the sensor substrate 200, as the same transparent conductive layer is patterned to form these elements.

The bridge line BL is disposed between the driving line TL of the first driving unit part TU1 with the driving line TL of the second driving unit part TU2, and is formed on the overcoating layer OC. The bridge line BL connects the driving line TL of the first driving unit part TU1 with the driving line TL of the second driving unit part TU2 through the first and second contact holes C1 and C2. The capping electrode CPE may be formed to cover an upper surface and a side surface of the pad electrode PDE.

Referring again to FIG. 4, the sensor substrate 200 may further include a column spacer 400 which is formed on the second base substrate 201 including the bridge line BL and may be formed from an organic material layer.

According to the illustrated exemplary embodiment, the bridge line BL directly contacts the liquid crystal layer 300. Thus, a texture may be undesirably generated by abnormal driving of the liquid crystal layer 300. To avoid generation of the texture, in the illustrated exemplary embodiment, a width of the blocking pattern BM in an area in which the bridge line BL is formed, is extended so that visibility of the texture may be reduced or effectively prevented. That is, a portion of the blocking pattern BM having a longitudinal axis parallel to that of the bridge line BL, may have a planar width taken perpendicular to the longitudinal axis thereof, which is larger than other portions of the blocking pattern BM.

According to the illustrated exemplary embodiment, the capping electrode CPE formed from the transparent conductive oxide material covers the pad electrode PDE so that oxidation of the pad electrode PDE may be reduced or effectively prevented. Thus, a reliability of driving the sensing display panel 500 may be improved.

According to the illustrated exemplary embodiment, a mask which is used for forming the color filter layer and/or the overcoating layer, may be modified to define a contact hole respectively therein. Thus, an additional mask used for specifically forming just the contact hole may be omitted.

Hereinafter, the same reference numerals are used to refer to the same or like parts as those described in the previous exemplary embodiments, and the same detailed explanations are omitted or simplified.

Figure 6:
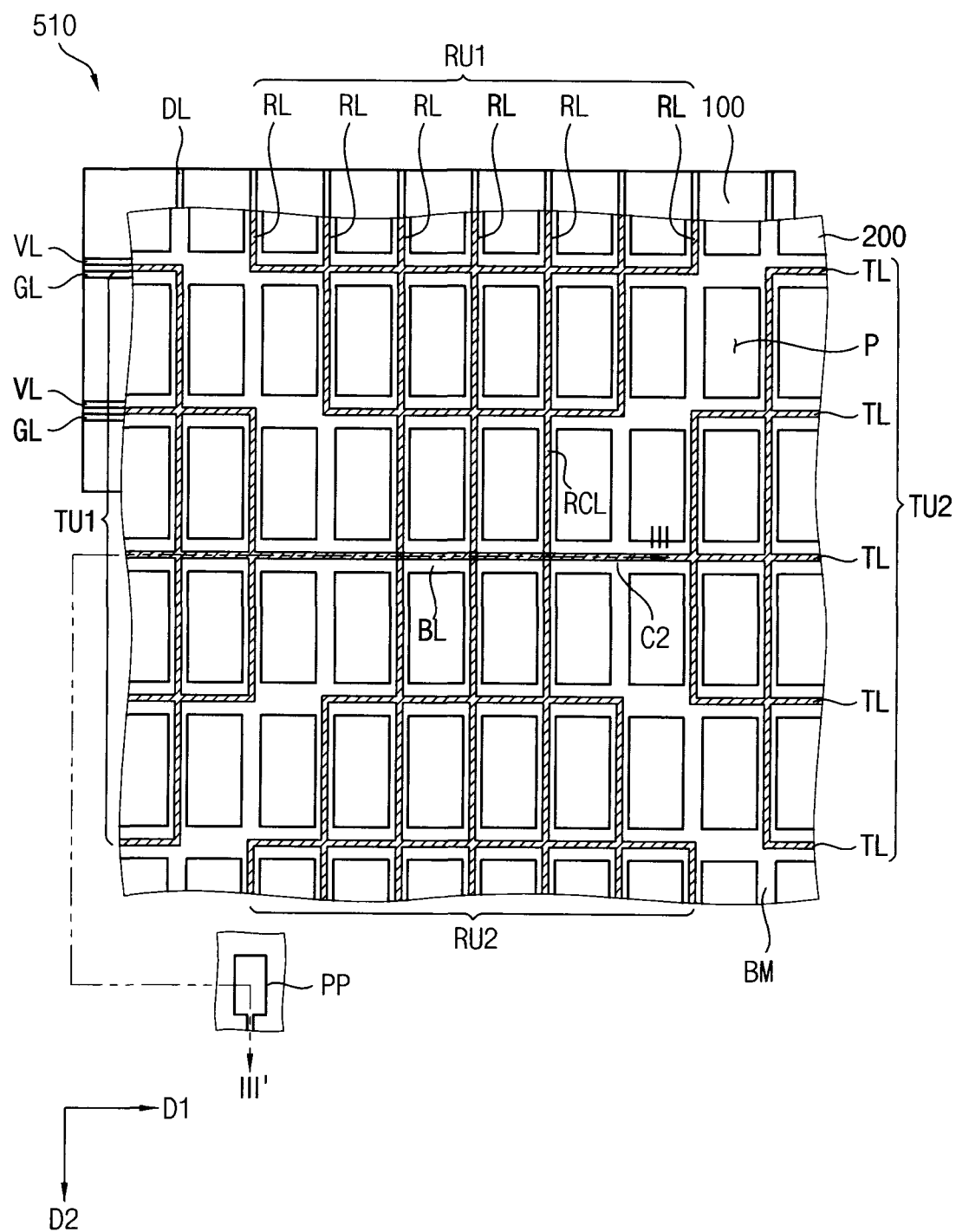
FIG. 6 is a cross-sectional view illustrating another exemplary embodiment of a sensing display panel according to the invention.
Figure 7:
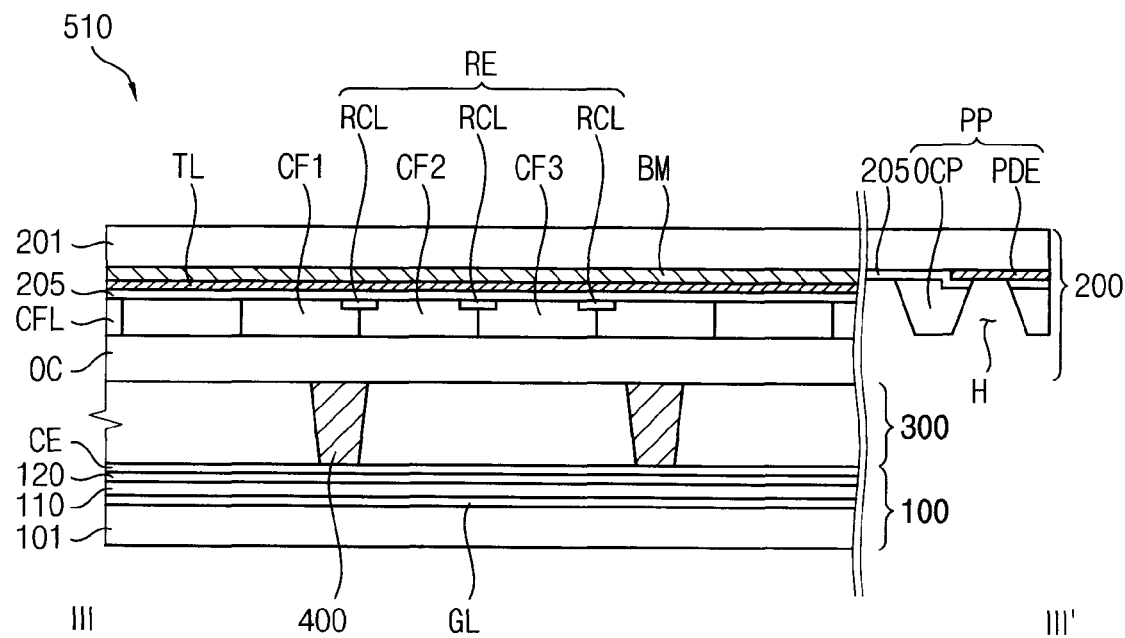
FIG. 7 is a cross-sectional view illustrating the sensing display panel taken along line III-III' as shown in FIG. 6.

FIG. 6 is a cross-sectional view illustrating another exemplary embodiment of a sensing display panel according to the invention. FIG. 7 is a cross-sectional view illustrating the sensing display panel taken along line III-III' as shown in FIG. 6.

Referring to FIGS. 1, 6 and 7, the sensing display panel 510 may include an active area AA, and a peripheral area PA surrounding the active area AA. The sensing display panel 510 may include a display substrate 100, a sensor substrate 200, a liquid crystal layer 300 and a column spacer 400.

The display substrate 100 includes substantially the same or like parts as those described in the previous exemplary embodiment and the same detailed explanations are omitted.

The sensor substrate 200 includes a second base substrate 201. A blocking pattern BM, one or more driving electrode TE, an insulating layer 205, one or more sensing electrode RE, a color filter layer CFL and an overcoating layer OC are disposed in the active area AA of the second base substrate 201. One or more pad PP is disposed in the peripheral area PA of the second base substrate 201. In the illustrated exemplary embodiment, the bridge line BL in the sensor substrate 200 may be omitted in comparison with the previous exemplary embodiment as shown in FIG. 4.

The blocking pattern BM is disposed on the second base substrate 201 and defines a transmission area at which light is transmitted and a blocking area at which the light is blocked. The transmission area may correspond to the pixel area P.

According to the illustrated exemplary embodiment, a plurality of driving electrodes TE are extended in the first direction D1 and arranged in the second direction D2. The driving electrode TE includes a plurality of driving unit parts TU1 and TU2 arranged in the first direction D1, and a driving connection line TCL connecting the driving unit parts TU1 and TU2 adjacent to each other in the first direction D1. The driving unit parts TU1 and TU2 each include a plurality of driving lines TL connected to each other in a mesh-type arrangement. The driving connection line TCL is continuous with and extended from the driving lines TL. The driving connection line TCL and the driving lines TL of the driving unit parts TU1 and TU2 adjacent to each other in the first direction D1 may form a single, unitary, indivisible member.

The insulating layer 205 is disposed on the second base substrate 201 to cover the driving electrodes TE.

A plurality of sensing electrodes RE is extended in the second direction D2 and arranged in the first direction D1. The sensing electrode RE includes a plurality of sensing unit parts RU1 and RU2 arranged in the second direction D2, and a sensing connection line RCL connecting the sensing unit parts RU1 and RU2 adjacent to each other in the second direction D2. The sensing unit parts RU1 and RU2 include a plurality of sensing lines RL connected to each other in a mesh-type arrangement. The sensing connection line RCL is continuous with and extended from the sensing lines RL. The sensing connection line RCL and the sensing lines RL of the sensing unit parts RU1 and RU2 adjacent to each other in the second direction D2 may form a single, unitary, indivisible member.

According to the illustrated exemplary embodiment, the insulating layer 205 is disposed between a first layer of the sensor substrate 200 in which the driving electrodes TE are located and a second layer of the sensor substrate 200 in which the sensing electrodes RE are located, so that the driving electrodes TE is electrically insulated from the sensing electrodes RE by the insulating layer 205. Thus, the bridge line BL described in the previous exemplary embodiment may be omitted.

The color filter layer CFL may include first, second and third color patterns CF1, CF2 and CF3. The first, second and third color patterns CF1, CF2 and CF3 are extended in the second direction D2 and arranged in the first direction D1.

The overcoating layer OC is disposed on the color filter layer CFL. The overcoating layer OC may have a planarized lower surface so as to planarize layers of the sensor substrate 200 and form a substantially flat surface of the sensor substrate 200.

According to the illustrated exemplary embodiment, the pad PP may include a pad electrode PDE and an overcoating pattern OCP. The insulating layer 205 is disposed between the pad electrode PDE and the overcoating pattern OCP. The pad electrode PDE may include a same metal material as the metal material of the driving lines TL. In an exemplary embodiment of forming the sensing display panel 500, the pad electrode PDE is formed from a same metal layer as a metal layer used for forming the driving line TL. The overcoating pattern OCP and the insulating layer 205 includes an opening H defined therein, which partially exposes the upper surface of the pad electrode PDE. The overcoating pattern OCP and the insulating layer 205 may cover a portion of an upper surface and a side surface of the pad electrode PDE. A terminal of a driving chip (not shown) may be coupled to the pad electrode PDE exposed through the opening H.

According to the illustrated exemplary embodiment, the overcoating pattern OCP may reduce or effectively prevent oxidation of the pad electrode PDE such as by moisture in the air. In comparison with the previous exemplary embodiment as shown in FIG. 4 including the bridge line BL, the driving connection line TCL continuous with and connected to the driving unit parts TU1 and TU2 of the exemplary embodiment in FIG. 7 may include a metal so that a resistance of the driving lines TL may be decreased.

Although not shown in figures, the pad electrode PDE may include a same metal material as that of the sensing electrode RE. In an exemplary embodiment of forming the sensing display panel 510, the pad electrode PDE be formed from the same metal layer as a metal layer used for forming the sensing electrode RE. In this case, the overcoating pattern OCP may be directly on the pad electrode PDE.

FIGS. 8A to 8E are cross-sectional views explaining an exemplary embodiment of a manufacturing method of the sensor substrate as shown in FIG. 7.

Figure 8A:
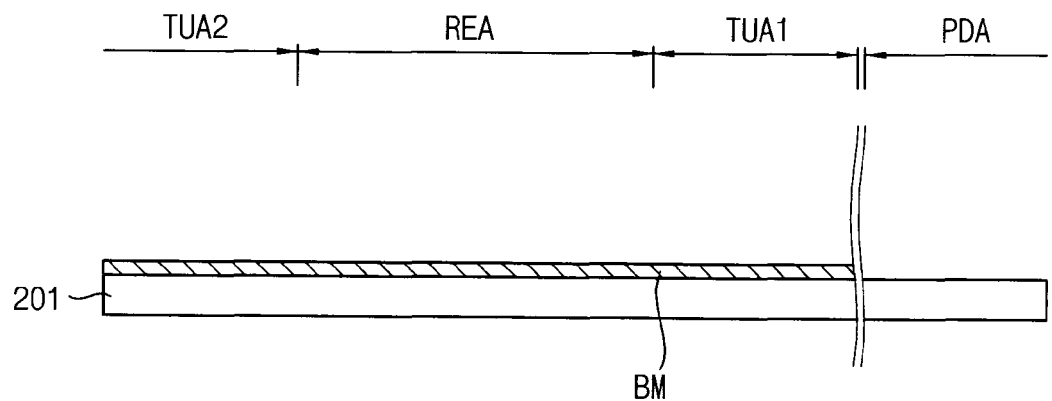
FIGS. 8A to 8E are cross-sectional views explaining an exemplary embodiment of a manufacturing method of a sensor substrate as shown in FIG. 7.

Referring to FIGS. 1, 7 and 8A, a blocking material is formed (e.g., provided) on the second base substrate 201. The blocking material is patterned using a mask to form a blocking pattern BM. The blocking pattern BM is formed in an active area AA of the second base substrate 201. An area in which the blocking pattern BM is formed may be defined as a blocking area and an area in which the blocking pattern BM is not formed may be defined as a transmission area corresponding to the pixel area P.

Figure 8B:
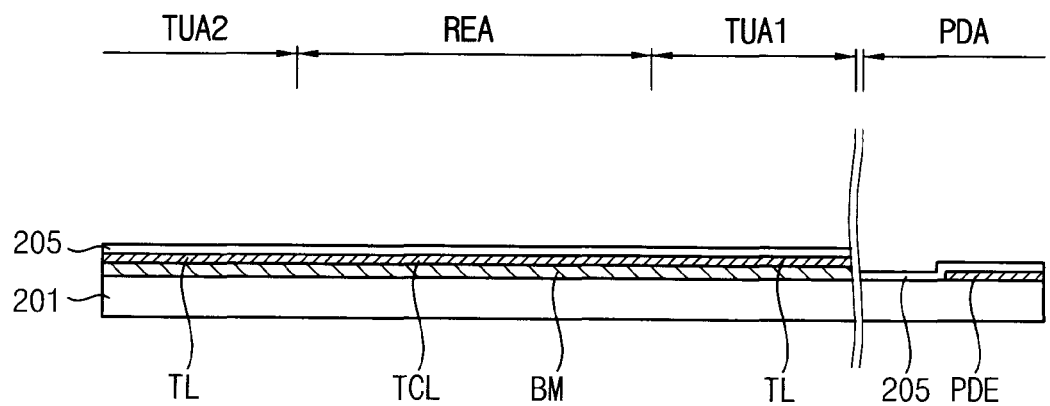

Referring to FIGS. 1, 7 and 8B, a first metal layer is formed on the second base substrate 201 including the blocking pattern BM. The first metal layer may include a metal such as chromium (Cr), aluminum (Al), tantalum (Ta), molybdenum (Mo), titanium (Ti), tungsten (W), copper (Cu), silver (Ag), etc. or alloy thereof. The first metal layer is patterned to form the driving line TL and the driving connection line TCL in the active area AA, and to form the pad electrode PDE in the peripheral area PA. The driving line TL, the driving connection line TCL and the pad electrode PDE may be considered formed from and/or in a same layer of the sensor substrate 200, as the same metal layer is patterned to form these elements.

The mesh-type driving lines TL are formed in an area in which the blocking pattern BM is formed and are connected to each other to form the driving unit parts TU1 and TU2. The driving unit parts TU1 and TU2 are respectively connected to driving unit parts TU which are adjacent in the first direction D1 through the driving connection line TCL. As shown in FIG. 8B, driving lines TL of the first driving unit part TU1 are formed in a first driving unit area TUA1 and driving lines TL of the second driving unit part TU2 are formed in a second driving unit area TUA2 which is spaced apart from the first driving unit area TUA1 in the first direction D1. The driving connection line TCL is formed in a sensing electrode area REA between the first and second driving unit areas TUA1 and TUA2 adjacent in the first direction D1, and the driving connection line TCL connects the first driving unit part TU1 with the second driving unit part TU2 arranged adjacent in the first direction D1.

One or more pad PP is disposed in a pad area PDA of the second base substrate 201. The pad electrode PDE of the pad PP is formed in the pad area PDA.

An insulating layer 205 is formed on the second base substrate 201 including the driving line TL, the driving connection line TCL and the pad electrode PDE. The insulating layer 205 may include silicon nitride (SiNx), silicon oxide (SiOx), and may be formed by plasma enhanced chemical vapor deposition ("PECVD"). In addition, the insulating layer 205 may include a double layer structure formed by different methods and/or having different materials from each other.

Figure 8C:
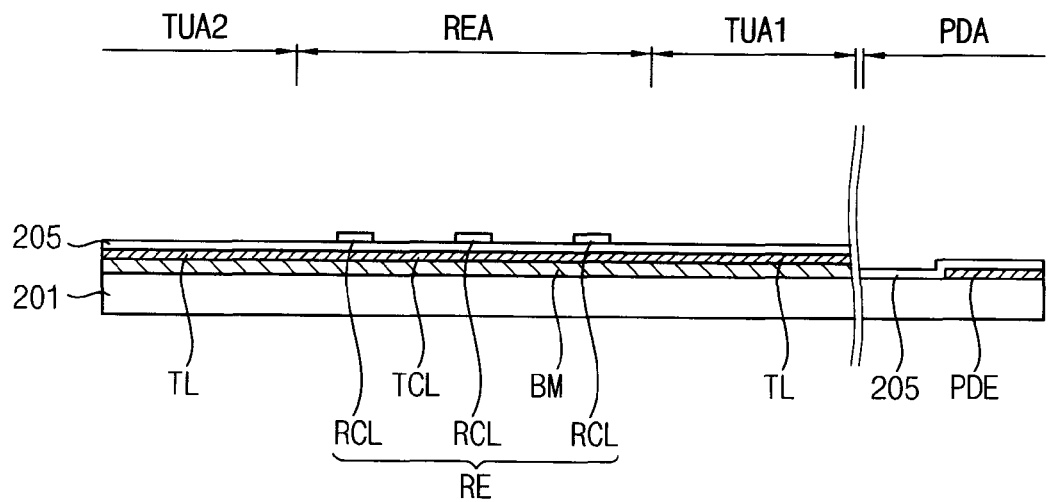

Referring to FIGS. 1, 7 and 8C, a second metal layer is formed on the second base substrate 201 including the insulating layer 205. The second metal layer may include metal such as chromium (Cr), aluminum (Al), tantalum (Ta), molybdenum (Mo), titanium (Ti), tungsten (W), copper (Cu), silver (Ag), etc. or alloy thereof. The second metal layer is patterned to form the sensing line RL and the sensing connection line RCL in the active area AA.

The sensing unit parts RU1 and RU2 are respectively connected to adjacent sensing unit parts RU adjacent in the second direction D2 through the sensing connection line RCL. As shown in FIG. 8C, the sensing connection line RCL is formed in the sensing electrode area REA between the first and second driving unit areas TUA1 and TUA2, and the sensing connection line RCL is connected to the first sensing unit part RU1 and the second sensing unit part RU2 arranged adjacent in the second direction D2.

Figure 8D:
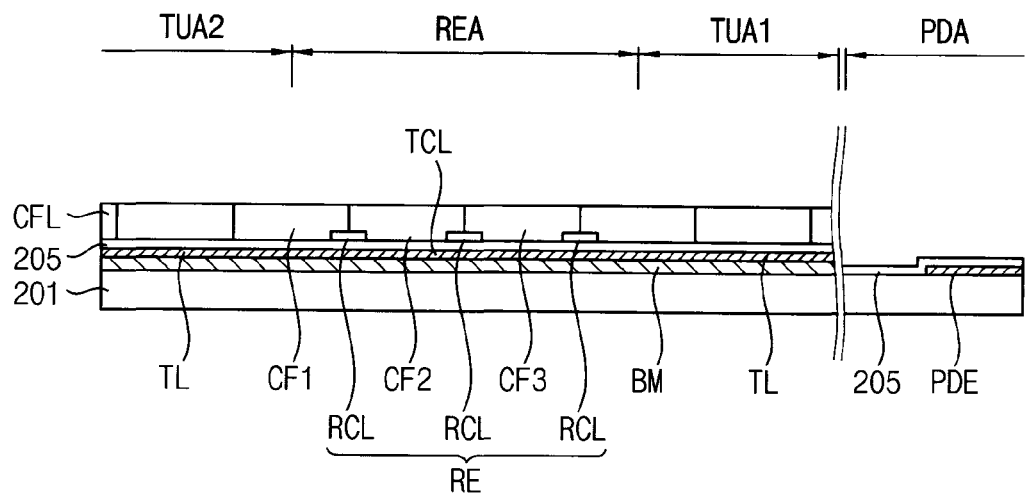

Referring to FIGS. 1, 7 and 8D, a color filter layer CFL is formed on the second base substrate 201 including the sensing line RL and the sensing connection line RCL. The color filter layer CFL is formed in the active area AA.

In one exemplary embodiment, for example, a first color photoresist layer is formed on the second base substrate 201. The first color photoresist layer is patterned using a first color-mask to form a first color pattern CF1 extended in the second direction D2. A second color photoresist layer is formed on the second base substrate 201 including the first color pattern CF1. The second color photoresist layer is patterned using a second color-mask so that a second color pattern CF2 is formed parallel with the first color pattern CF1. A third color photoresist layer is formed on the second base substrate 201 including the first and second color patterns CF1 and CF2. The third color photoresist layer is patterned using a third color-mask so that a third color pattern CF3 is formed parallel with the second color pattern CF2.

Figure 8E:
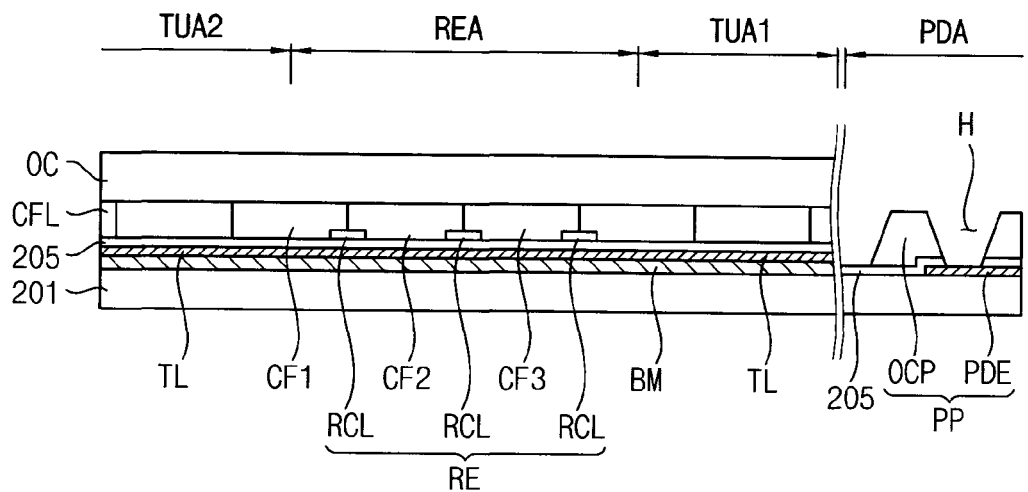

Referring to FIGS. 1, 7 and 8E, the overcoating layer OC is formed on the second base substrate 201 including the color filter layer CFL. The overcoating layer OC includes an overcoating pattern OCP disposed on the pad electrode PDE.

As shown in FIG. 8E, the overcoating layer OC may planarize a surface of the color filter layer CFL formed in active area AA. The overcoating pattern OCP includes an opening H which partially exposes the upper surface of the insulating layer 205. The overcoating pattern OCP may cover a portion of an upper surface and a side surface of the insulating layer 205. The insulating layer 205 on the pad electrode PDE is exposed through the opening H.

Then, the insulating layer 205 exposed through the opening H is removed using the overcoating pattern OCP as a mask, and thus the pad electrode PDE is exposed. Thus, the pad PP may include the pad electrode PDE and the overcoating pattern OCP.

According to the illustrated exemplary embodiment, the insulating layer 205 is formed between the driving electrode TE and the sensing electrode RE so that a contact hole in the color filter layer CFL and the overcoating layer OC to connect adjacent driving unit parts TU may be omitted. Therefore, a process for forming the contact hole may be omitted.

In addition, the overcoating pattern OCP may reduce or effectively prevent oxidation of the pad electrode PDE such as by moisture in the air.

Figure 9:
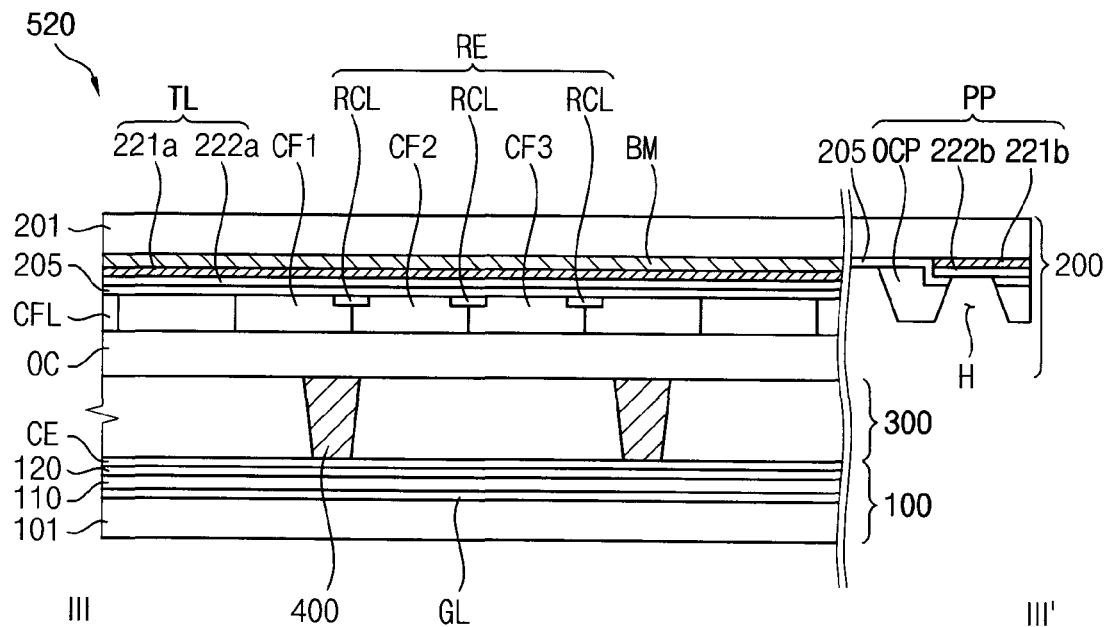
FIG. 9 is a cross-sectional view illustrating still another exemplary embodiment of a sensing display panel according to the invention.

FIG. 9 is a cross-sectional view illustrating still another exemplary embodiment of a sensing display panel according to the invention.

Referring to FIG. 9, according to the illustrated exemplary embodiment, the sensing display panel 520 includes a driving electrode TE and a pad electrode PDE having a double-layered structure. The sensing display panel 520 according to the illustrated exemplary embodiment includes substantially the same or like parts as those described in the previous exemplary embodiment as shown in FIG. 7, except for the driving electrode TE and pad electrode PDE, and the same detailed explanations are omitted.

According to the illustrated exemplary embodiment, the sensing display panel 520 may include an active area AA, and a peripheral area PA surrounding the active area AA. The sensing display panel 520 may include a display substrate 100, a sensor substrate 200, a liquid crystal layer 300 and a column spacer 400.

The sensor substrate 200 includes a second base substrate 201. A blocking pattern BM, one or more driving electrode TE, an insulating layer 205, one or more sensing electrode RE, a color filter layer CFL and an overcoating layer OC are disposed in the active area AA of the second base substrate 201. One or more pad PP is disposed in a pad area PDA of the second base substrate 201.

According to the illustrated exemplary embodiment, a plurality of driving electrodes TE are extended in the first direction D1 and arranged in the second direction D2. The driving electrode TE includes a plurality of driving unit parts TU1 and TU2 arranged in the first direction D1, and a driving connection line TCL connecting the driving unit parts TU1 and TU2 adjacent to each other in the first direction D1. The driving unit parts TU1 and TU2 each include a plurality of driving lines TL connected to each other in a mesh-type arrangement. In an exemplary embodiment of forming the sensing display panel 520, the driving connection line TCL is formed from a same metal layer as a metal layer used for forming the driving line TL.

According to the illustrated exemplary embodiment, the driving line TL and the driving connection line TCL have the double-layered structure. In one exemplary embodiment, for example, each of the driving line TL and the driving connection line TCL includes a metal line 221a including a metal material and a transparent line 222a including a transparent conductive material. In an exemplary embodiment of forming the sensing display panel 520, the metal line 221a is formed from a metal layer and the transparent line 222a is formed from a transparent conductive layer. The metal line 221a may include a metal such as chromium (Cr), aluminum (Al), tantalum (Ta), molybdenum (Mo), titanium (Ti), tungsten (W), copper (Cu), silver (Ag), etc. or alloy thereof. The transparent line 222a may include a transparent conductive oxide material such as ITO, IZO, a-ITO and so on so.

In addition, the pad PP according to the illustrated exemplary embodiment includes a pad electrode 221b, a capping electrode 222b and an overcoating pattern OCP. The insulating layer 205 may be between the pad electrode 221b and the capping electrode 222b. The pad electrodes 221b includes the same metal layer as the metal line 221a, a capping electrode 222b includes the same transparent conductive material as the transparent line 222a and the overcoating pattern OCP includes the same material as the overcoating layer OC. In an exemplary embodiment of forming the sensing display panel 520, the pad electrode 221b is formed from the same metal layer as the metal line 221a, a capping electrode 222b formed from the same transparent conductive layer as the transparent line 222a, and the overcoating pattern OCP is formed from a same material layer as the overcoating layer OC. The capping electrode 222b may be exposed by the insulating layer 205 and the overcoating pattern OCP.

A method of manufacturing the sensor substrate 200 of the sensing display panel 520 according to the illustrated exemplary embodiment, includes substantially the same process as that described in the previous exemplary embodiment as shown in FIGS. 8A to 8E, except for forming the driving line TL, the driving connection line TCL and the pad PP using a double layer including the metal layer and the transparent conductive layer.

According to the illustrated exemplary embodiment, the overcoating pattern OCP covers a portion of the pad electrode 221b, and the capping electrode 222b covers the pad electrode 221b so that the damage to pad electrode 221b by moisture in the air may be reduced or effectively prevented. Thus, a reliability of driving the sensing display panel 520 may be improved.

Figure 10:
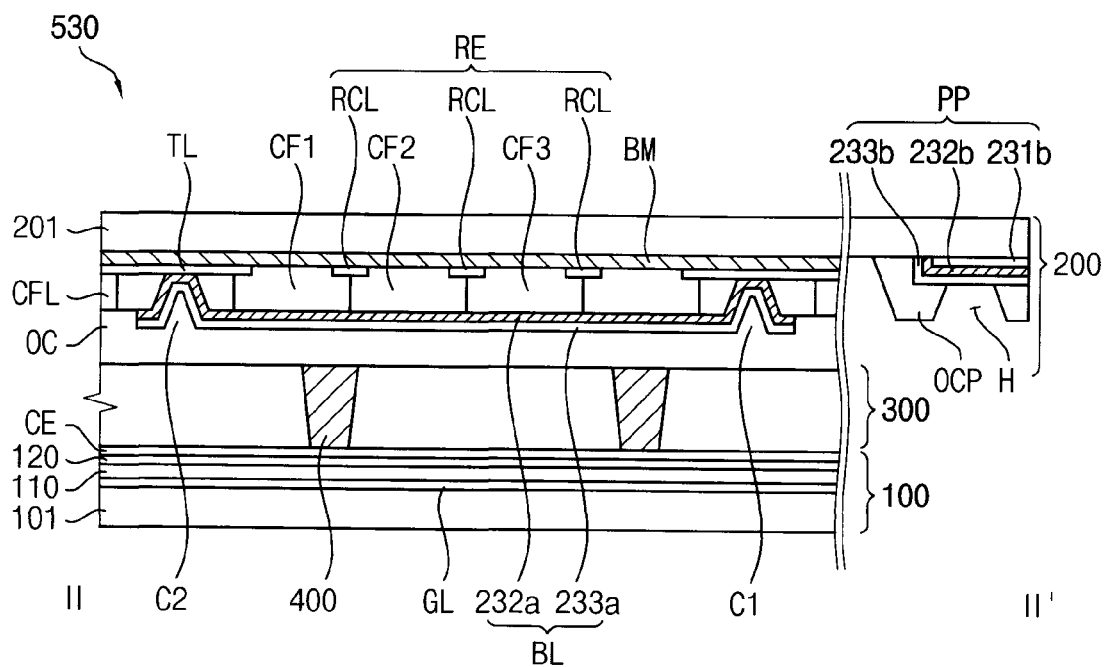
FIG. 10 is a cross-sectional view illustrating still another exemplary embodiment of a sensing display panel according to the invention.

FIG. 10 is a cross-sectional view illustrating still another exemplary embodiment of a sensing display panel according to the invention.

Referring to FIGS. 1, 2 and 10, the sensing display panel 530 may include an active area AA, and a peripheral area PA surrounding the active area AA. The sensing display panel 530 may include a display substrate 100, a sensor substrate 200, a liquid crystal layer 300 and a column spacer 400.

The display substrate 100 is substantially the same as that described in the previous exemplary embodiments, and the same detailed explanations are omitted.

The sensor substrate 200 includes a second base substrate 201, a blocking pattern BM, one or more driving electrode TE, one or more sensing electrode RE, a color filter layer CFL, an overcoating layer OC and one or more pad PP. The blocking pattern BM, the driving electrodes TE, the sensing electrodes RE, the color filter layer CFL and the overcoating layer OC are disposed in the active area AA of the second base substrate 201. The pads PP are disposed in the peripheral area PA of the second base substrate 201. A bridge line BL according to the illustrated exemplary embodiment, is disposed on the overcoating layer OC. The bridge line BL in FIG. 10 is between the color filter layer CFL and the overcoating layer OC, whereas in FIG. 4, the overcoating layer OC is between the bridge line BL and the color filter layer CFL. The bridge line BL and the pad PP according to the illustrated exemplary embodiment in FIG. 10 have different structures from those of the previous exemplary embodiment as shown in FIG. 4.

According to the illustrated exemplary embodiment, a plurality of driving electrodes TE is extended in the first direction D1 and arranged in the second direction D2. The driving electrode TE includes a plurality of bridge lines BL. The bridge lines BL connects a plurality of driving unit parts TU adjacent each other in the first direction D1. Referring to FIG. 1, for example, the bridge lines BL connect driving unit parts TU1 and TU2 adjacent in the first direction D1. The bridge line BL includes a different metal material than the metal material of the driving line TL of the driving electrode TE. In an exemplary embodiment of forming the sensing display panel 530, the bridge line BL is formed from a different metal layer than a metal layer used for forming the driving line TL. The bridge line BL has a double-layered structure including a metal line 232a including the metal material and a transparent line 233a including the transparent conductive material. In an exemplary embodiment of forming the sensing display panel 530, the bridge line BL includes the metal line 232a formed from the metal layer and the transparent line 233a formed from the transparent conductive layer.

A plurality of sensing electrodes RE is extended in the second direction D2 and arranged in the first direction D1. The sensing electrode RE include a plurality of sensing unit parts RU1 and RU2 arranged adjacent in the second direction D2 and a sensing connection line RCL connecting the sensing unit parts RU1 and RU2 adjacent in the second direction D2. The sensing unit parts RU1 and RU2 include a plurality of sensing lines RL connected to each other in a mesh-type structure. The sensing connection line RCL includes a same metal material as a metal material of the sensing line RL. In an exemplary embodiment of forming the sensing display panel 530, the sensing connection line RCL is formed from the same metal layer as the metal layer used for forming the sensing line RL.

The color filter layer CFL may include first, second and third color patterns CF1, CF2 and CF3. The first, second and third color patterns CF1, CF2 and CF3 are extended in the second direction D2 and arranged in the first direction D1. The color filter layer CFL includes first and second contact holes C1 and C2 which respectively expose the driving lines TL of adjacent driving unit parts TU1 and TU2 adjacent in the first direction D1. The bridge line BL is between and connected to the driving unit parts TU1 and TU2 adjacent in the first direction D1 through the first and second contact holes C1 and C2.

According to the illustrated exemplary embodiment, the pad PP includes a pad electrode 231b and 232b, a capping electrode 233b and an overcoating pattern OCP. The pad electrode includes a first metal electrode 231b including the same metal material as the metal material of the sensing line RL and a second metal electrode 232b including the same metal layer as the metal layer of the metal line 232a of the bridge line BL. In an exemplary embodiment of forming the sensing display panel 530, the pad electrode includes the first metal electrode 231*b* formed from the same metal layer as the metal layer used for forming the sensing line RL and a second metal electrode 232*b* formed from the same metal layer as the metal layer used for forming the metal line 232*a* of the bridge line BL. The first metal electrode 231*b* and the sensing line RL may be considered formed from and/or in a same layer of the sensor substrate 200, as the same metal layer is patterned to form these elements.

The capping electrode 233*b* includes the same transparent conductive material as the transparent conductive material of the transparent line 233*a* of the bridge line BL. In an exemplary embodiment of forming the sensing display panel 530, the capping electrode 233*b* is formed from the same transparent conductive layer as the transparent conductive layer used for forming the transparent line 233*a* of the bridge line BL. The capping electrode 233*b* and the transparent line 233*a* may be considered formed from and/or in a same layer of the sensor substrate 200, as the same transparent conductive layer is patterned to form these elements.

According to the illustrated exemplary embodiment, the capping electrode 233*b* and the overcoating pattern OCP covers the pad electrode 231*b* and 232*b* so that damage to the pad electrode 231*b* and 232*b* from moisture in the air may be reduced or effectively prevented. In addition, the bridge line BL includes the metal line 232*a* so that a resistance of the bridge line BL may be decreased. Therefore, a reliability of driving the sensing display panel 530 may be improved.

FIGS. 11A to 11E are cross-sectional views explaining an exemplary embodiment of a manufacturing method of the sensor substrate as shown in FIG. 10.

Figure 11A:
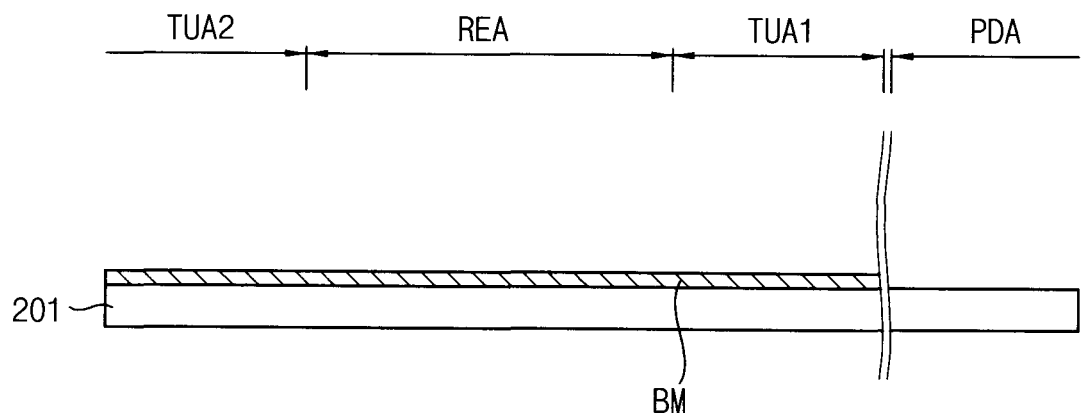
FIGS. 11A to 11E are cross-sectional views explaining one manufacturing method of a sensor substrate as shown in FIG. 10.

Referring to FIGS. 2, 10 and 11A, a blocking layer is formed (e.g., provided) on the second base substrate 201. The blocking layer is patterned to form a blocking pattern BM.

Figure 11B:
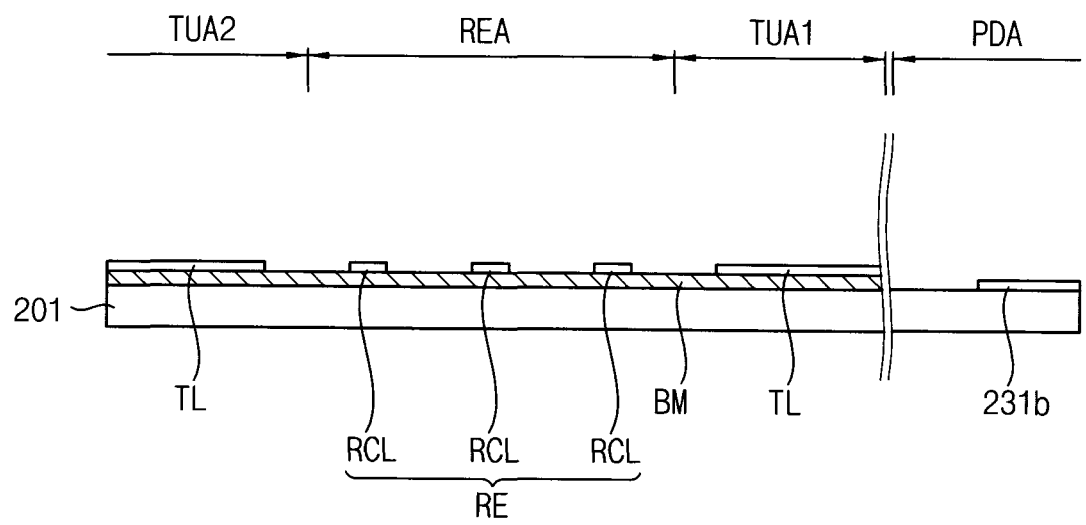

Referring to FIGS. 2, 10 and 11B, a metal layer is formed on the second base substrate 201 including the blocking pattern BM. The metal layer includes metal such as chromium (Cr), aluminum (Al), tantalum (Ta), molybdenum (Mo), titanium (Ti), tungsten (W), copper (Cu), silver (Ag), etc. or alloy thereof. The metal layer is patterned to form the driving line TL, the sensing line RL, the sensing connection line RCL and the first metal electrode 231*b* of the pad electrode.

As shown in FIG. 11B, driving lines TL of the first driving unit part TU1 are formed in a first driving unit area TUA1, and driving lines TL of the second driving unit part TU2 are formed in a second driving unit area TUA2 spaced apart from the first driving unit area TUA1 in the first direction D1.

The sensing lines RL are formed in an area in which the blocking pattern BM is formed. The sensing lines RL are connected to each other in a mesh-type arrangement to form the sensing unit parts RU1 and RU2. As shown in FIG. 11B, the sensing connection line RCL is formed in a sensing electrode area REA between the first and second driving unit areas TUA1 and TUA2, and the sensing connection line RCL connects the first sensing unit part RU1 with the second sensing unit part RU2 arranged in the second direction D2.

Figure 11C:
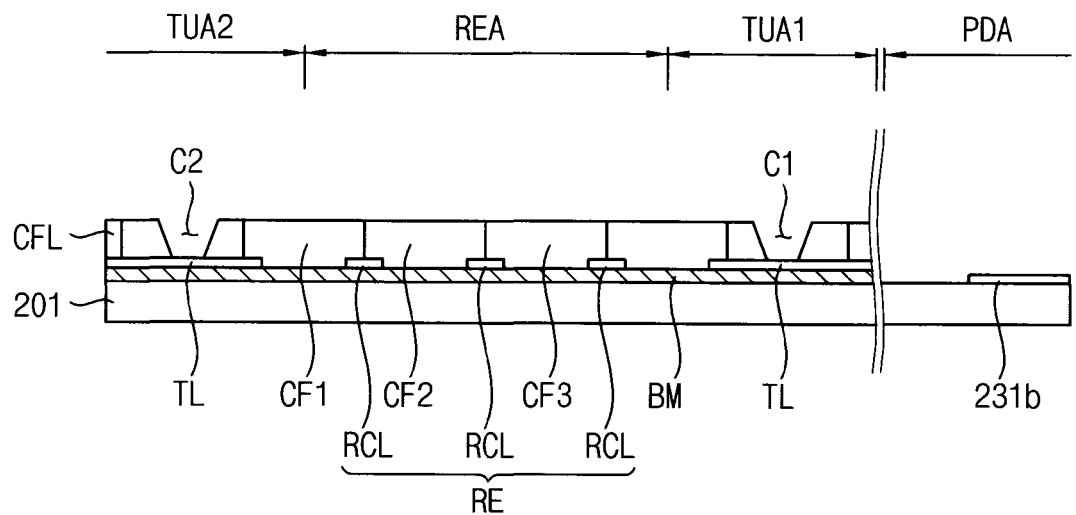

Referring to FIGS. 2, 10 and 11C, a color filter layer CFL is formed on the second base substrate 201 including the driving line TL, the sensing line RL, the sensing connection line RCL and the first metal electrode 231*b* of the pad electrode PDE, and then first and second contact holes C1 and C2 are formed in the color filter layer CFL. The first contact hole C1 exposes the driving line TL of the first driving unit part TU1 and the second contact hole C2 exposes the driving line TL of the second driving unit part TU2.

Figure 11D:
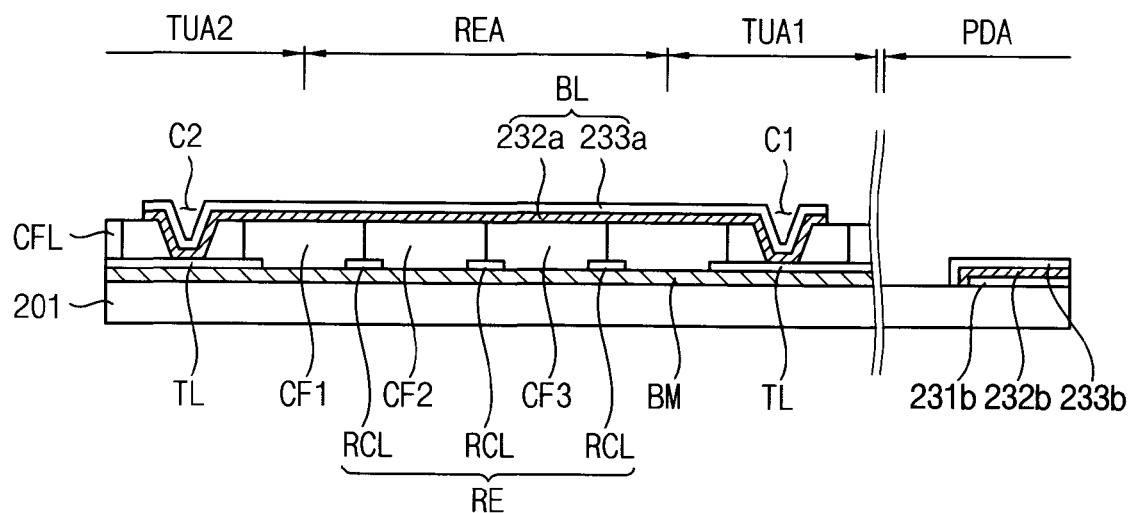

Referring to FIGS. 2, 10 and 11D, a metal layer and a transparent conductive layer are sequentially formed on the second base substrate 201 including the first and second contact holes C1 and C2.

The metal layer and the transparent conductive layer are patterned together to form the metal line 232*a* and the transparent line 233*a* of the bridge line BL, and the second metal electrode 232*b* and the capping electrode 233*b* of the pad electrode.

The bridge line BL including the metal line 232*a* and the transparent line 233*a* is connected to the driving line TL of the first driving unit part TU1 and the driving line TL of the second driving unit part TU2 through the first and second contact holes C1 and C2. The bridge line BL includes the metal line 232*a* so that a resistance of the bridge line BL may be decreased.

The second metal electrode 232*b* and the capping electrode 233*b* may cover the upper surface and a side surface of the first metal electrode 231*b* of the pad electrode. In addition, the capping electrode 233*b* may cover the first and second metal electrodes 231*b* and 232*b* of the pad electrode so that damage to the pad electrode 231*b* and 232*b* by moisture in the air may be reduced or effectively prevented.

Figure 11E:
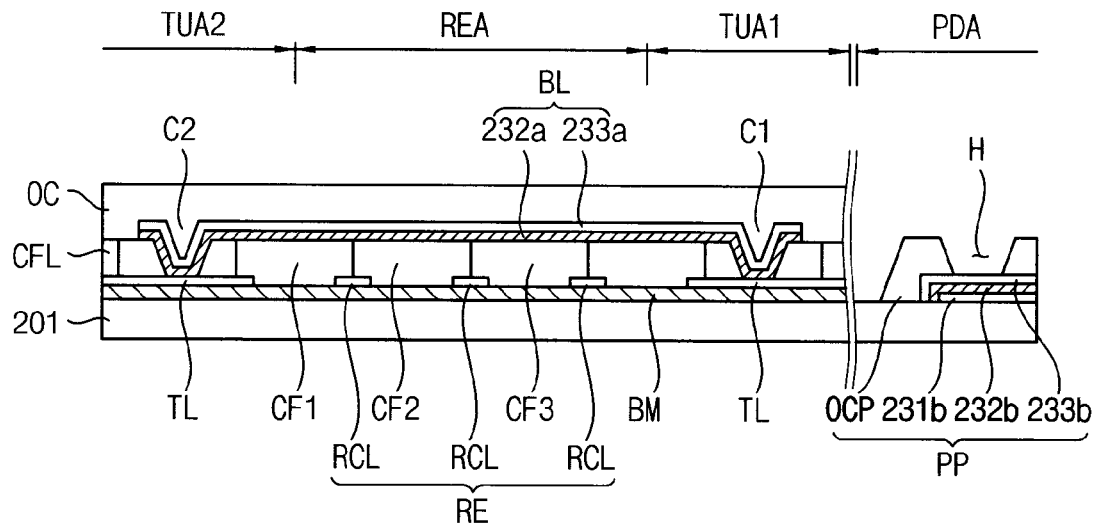

Referring to FIGS. 2, 10 and 11E, an overcoating layer OC is formed on the second base substrate 201 including the bridge line BL and the pad electrode. The overcoating layer OC may include an overcoating pattern OCP disposed on the pad electrode. As shown in FIG. 11E, the overcoating layer OC may be planarize a surface of the color filter layer CFL formed in active area AA to be flat or substantially flat. The overcoating pattern OCP includes an opening H defined therein which partially exposes the upper surface of the pad electrode. The overcoating pattern OCP covers a remainder of the upper surface except for the exposed portion, and the side surface of the capping electrode 233*b*. The capping electrode 233*b* is exposed through the opening H so that a terminal of a driving chip may be coupled to the pad electrode exposed through the opening H.

As shown in FIG. 11E, the overcoating layer OC is disposed on the color filter layer CFL in the active area AA. The overcoating pattern OCP is disposed on the capping electrode 233*b* in the pad area PDA and includes the opening H corresponding to the partial upper surface of the capping electrode 233*b*. The partial upper surface of the capping electrode 233*b* is exposed through the opening H.

According to the illustrated exemplary embodiment, a same mask which is used for forming the color filter layer, may be modified to also form the contact holes. Thus, an additional mask used for specifically forming the contact holes may be omitted.

According to the illustrated exemplary embodiment, the bridge line BL includes the metal line 232*a* so that the resistance of the bridge line BL may be decreased. In addition, the capping electrode 233*b* and the overcoating pattern OCP may reduce or effectively prevent damage to the pad electrode 231*b* and 232*b* by moisture in the air.

Figure 12:
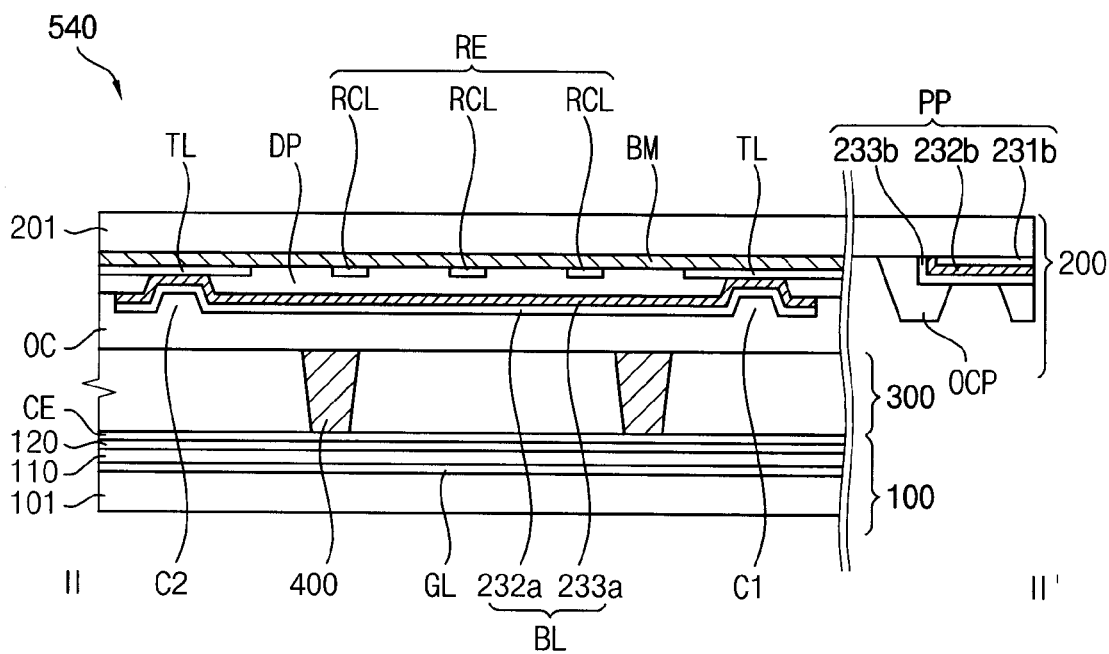
FIG. 12 is a cross-sectional view illustrating still another exemplary embodiment of a sensing display panel according to the invention.

FIG. 12 is a cross-sectional view illustrating still another exemplary embodiment of a sensing display panel according to the invention.

Referring to FIGS. 1, 2 and 12, the sensing display panel 540 may include an active area AA, and a peripheral area PA surrounding the active area AA. The sensing display panel 540 may include a display substrate 100, a sensor substrate 200, a liquid crystal layer 300 and a column spacer 400.

The sensor substrate 200 may include a second base substrate 201, a blocking pattern BM, one or more driving electrode TE, one or more sensing electrode RE, a color filter layer, an overcoating layer OC and one or more pad PP. The blocking pattern BM, the driving electrodes TE, the sensing electrodes RE, the color filter layer and the overcoating layer OC are in the active area AA of the second base substrate 201. The pads PP are in the peripheral area PA of the second base substrate 201.

The blocking pattern BM is disposed on the second base substrate 201 and defines a transmission area at which light is transmitted and a blocking area at which the light is blocked. The transmission area may correspond to the pixel area P.

A plurality of driving electrodes TE is extended in the first direction D1 and arranged in the second direction D2. The driving electrode TE includes a plurality of driving unit parts TU1 and TU2 arranged in the first direction D1, and a plurality of bridge lines BL connecting the driving unit parts TU1 and TU2 adjacent to each other in the first direction D1.

The driving unit part TU includes a plurality of driving lines TL connected to each other in a mesh-type arrangement.

The bridge line BL includes a different metal material than that of the driving line TL. In an exemplary embodiment of forming the sensing display panel 540, the bridge line BL is formed from a different metal layer than the metal layer used for forming the driving line TL. The bridge line BL may include and be formed from a double layer including a metal layer and a transparent conductive layer, thus the bridge line BL includes a metal line 232a and a transparent line 233a. The bridge line BL includes the metal line 232a so that the resistance of the bridge line BL may be decreased.

A plurality of sensing electrodes RE is extended in the second direction D2 and arranged in the first direction D1. The sensing electrode RE include a plurality of sensing unit parts RU1 and RU2 arranged in the second direction D2, and a sensing connection line RCL connecting sensing unit parts RU1 and RU2 adjacent in the second direction D2. The sensing unit parts RU1 and RU2 include a plurality of sensing lines RL connected to each other in a mesh-type arrangement. The sensing connection line RCL includes and is formed from the same metal layer as the metal layer used for forming the sensing line RL.

According to the illustrated exemplary embodiment, the color filter layer includes first color, second color and third color patterns and a dummy color pattern DP. According to the illustrated exemplary embodiment, each of the first color, second color and third color patterns is disposed in the pixel area P such as an island shape. As an island shape the color pattern is a discrete floating member on the second base substrate 201. The first color, second color and third color patterns respectively having the island shape have a predetermined thickness taken perpendicular to the plane of the second substrate 201. The predetermined thickness may be preset to a thickness which changes light transmitted from the display substrate 100 into color light having a predetermined pure color. In one exemplary embodiment, for example, the predetermined thickness may be about 1 micrometer (μm).

The dummy color pattern DP is disposed in a spacing area between adjacent driving unit parts TU1 and TU2 adjacent in the first direction D1, and crosses the sensing connection line RCL. The dummy color pattern DP includes first and second contact holes C1 and C2 defined therein and respectively exposing the driving lines TL of the driving unit parts TU1 and TU2. The bridge line BL is between and connected to the driving unit parts TU1 and TU2 adjacent in the first direction through the first and second contact holes C1 and C2 defined in the dummy color pattern DP. The dummy color pattern DP has a thickness less than that of the color patterns.

The metal material or the metal layer of the driving line TL and/or the sensing line RL has poor step coverage. In exemplary embodiments, for example, a disconnection failure may occur in a step portion of the metal layer in which a tapered angle of a side thereof is equal to or more than about 50 degrees, and a thickness difference or height of the step portion is equal to or more than about 5000 angstroms (Å). Therefore, the thickness of the dummy color pattern DP may be smaller than that in the previous exemplary embodiments having just the color patterns CF, so that disconnection of the metal line 232a in the bridge line BL may be reduced or effectively prevented.

The overcoating layer OC is disposed on the color filter layer including the color patterns and the dummy color pattern DP, so that a surface of the color filter layer CFL is planarized to be flat or substantially flat.

According to the illustrated exemplary embodiment, the pad PP may include a pad electrode 231b and 232b, a capping electrode 233b and an overcoating pattern OCP. The pad electrode includes a first metal electrode 231b and a second metal electrode 232b. The first metal electrode 231b includes the same metal material as the metal material of the sensing line RL and the second metal electrode 232b including the same metal layer as the metal layer of the metal line 232a of the bridge line BL. In an exemplary embodiment of forming the sensing display panel 540, the pad electrode includes the first metal electrode 231b formed from the same metal layer as the metal layer used for forming the sensing line RL, and the second metal electrode 231b is formed from the same metal layer as the metal layer used for forming the metal line 232a of the bridge line BL.

The capping electrode 233b includes the same transparent conductive material as the transparent conductive material of the transparent line 233a of the bridge line BL. In an exemplary embodiment of forming the sensing display panel 540 the capping electrode 233b is formed from the same conductive layer as the conductive layer used for forming the transparent line 233a of the bridge line BL.

According to the illustrated exemplary embodiment, the capping electrode 233b and the overcoating pattern OCP cover the pad electrode 231b and 232b so that damage to the pad electrode 231b and 232b by moisture in the air may be reduced or effectively prevented. In addition, the bridge line BL includes the metal line 232a so that the resistance of the bridge line BL may be decreased. Thus, the reliability of driving the sensing display panel 540 may be improved.

FIGS. 13A to 13D are cross-sectional views explaining an exemplary embodiment of a manufacturing method of the sensor substrate as shown in FIG. 12. FIGS. 14A to 14D are plan views explaining the exemplary embodiment of the manufacturing method of the sensor substrate as shown in FIG. 12.

Figure 13A:
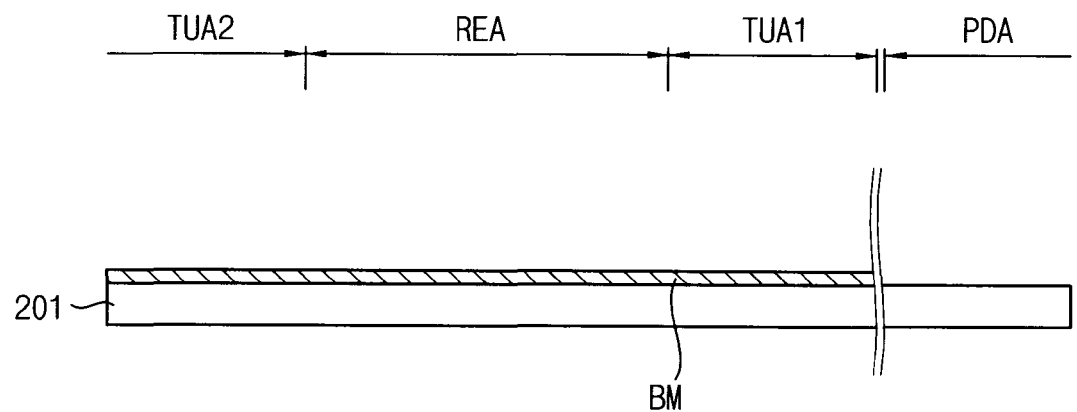
FIGS. 13A to 13E are cross-sectional views explaining one manufacturing method of a sensor substrate as shown in FIG. 12.
Figure 14A:
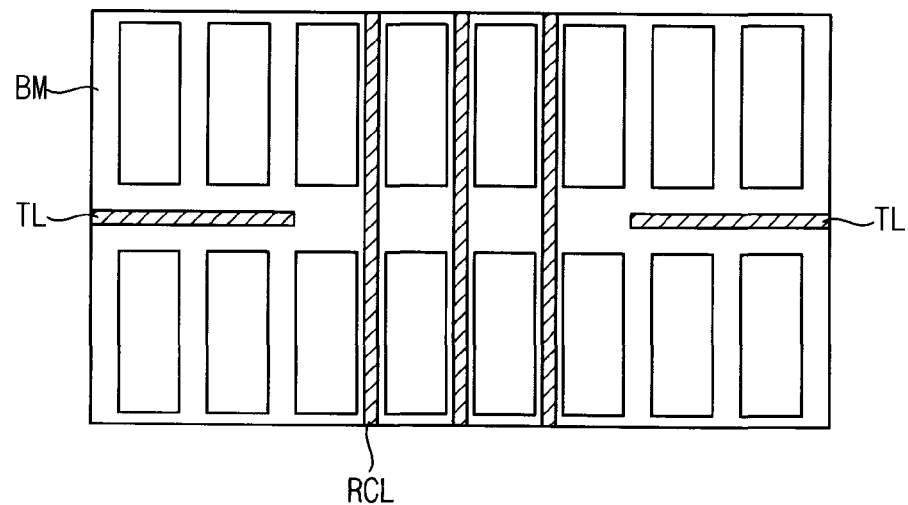
FIGS. 14A to 14D are plan views explaining one manufacturing method of a sensor substrate as shown in FIG. 12.

Referring to FIGS. 13A and 14A, a blocking layer is formed (e.g., provided) on the second base substrate 201. The blocking layer is patterned to form a blocking pattern BM.

Figure 13B:
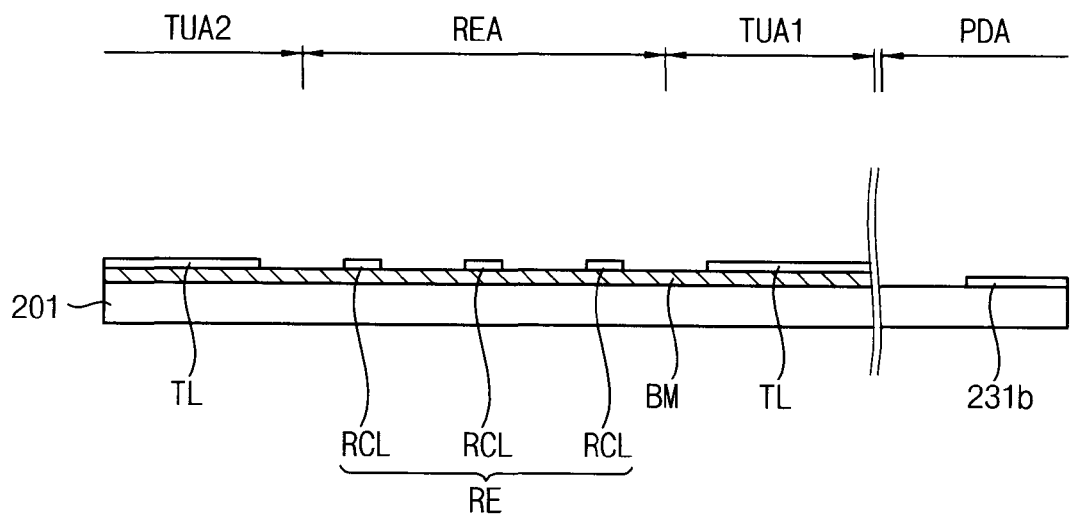

Referring to FIGS. 13B and 14A, a metal layer is formed on the second base substrate 201 including the blocking pattern BM. The metal layer includes metal such as chromium (Cr), aluminum (Al), tantalum (Ta), molybdenum (Mo), titanium (Ti), tungsten (W), copper (Cu), silver (Ag), etc. or alloy thereof. The metal layer is patterned to form the driving line TL, the sensing line RL, the sensing connection line RCL and a first metal electrode 231b of the pad electrode.

As shown in FIG. 13B, driving lines TL of the first driving unit part TU1 are formed in a first driving unit area TUA1, and driving lines TL of the second driving unit part TU2 are formed in a second driving unit area TUA2 adjacent to the first driving unit area TUA1 in the first direction D1.

The sensing lines RL are formed in an area in which the blocking pattern BM is formed. The sensing lines RL are connected to each other in a mesh-type arrangement to form the sensing unit parts RU1 and RU2. As shown in FIG. 13B, the sensing connection line RCL is formed in a sensing electrode area REA between the first and second driving unit areas TUA1 and TUA2 adjacent in the first direction. The sensing connection line RCL connects the first sensing unit part RU1 and the second sensing unit part RU2 which are arranged in the second direction D2.

Figure 13C:
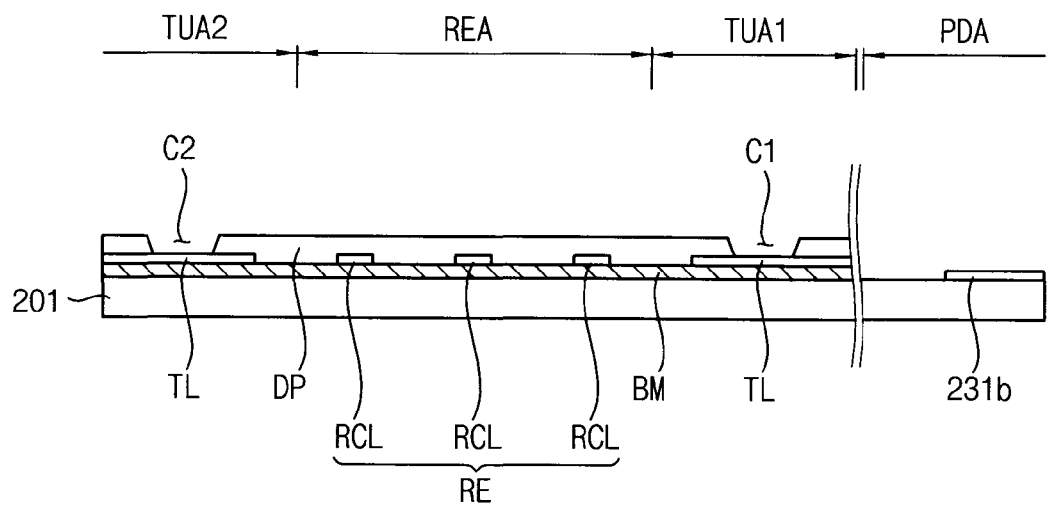
Figure 14B:
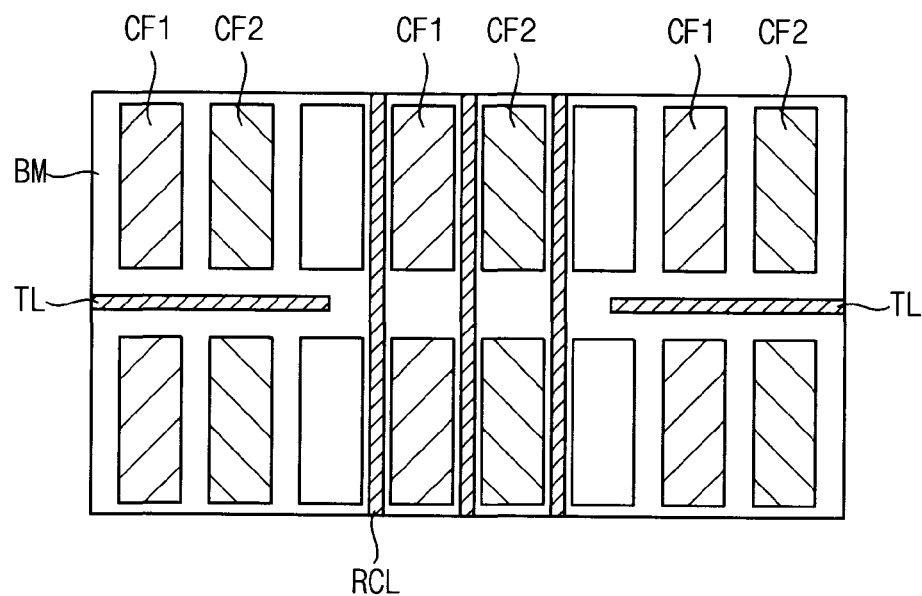

Referring to FIGS. 13C and 14B, a first color photoresist layer is formed on the second base substrate 201. The first color photoresist layer is patterned using a first color-mask to form a plurality of first color patterns CF1 which is arranged in the second direction D2, where each first color pattern CF1 has an island shape. A second color photoresist layer is formed on the second base substrate 201 including the first color patterns CF1. The second color photoresist layer is patterned using a second color-mask to form a plurality of second color patterns CF2 extended parallel with the first color patterns CF1, where each second color pattern CF2 has the island shape.

Figure 14C:
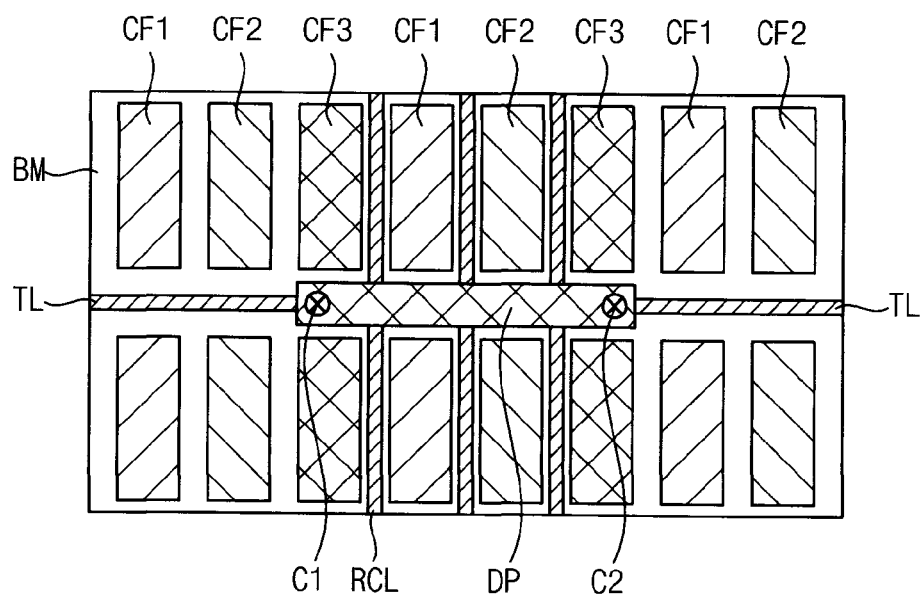

Referring to FIGS. 13C and 14C, a third color photoresist layer is formed on the second base substrate 201 including the first and second color patterns CF1 and CF2. The third color photoresist layer is patterned using a third color-mask to form a plurality of third color patterns CF3 extended parallel with the second color patterns CF2 and each having the island shape, and a plurality of dummy color patterns DP.

According to the illustrated exemplary embodiment, the color photoresist layer may be referred to as a negative photoresist. According to the negative photoresist, the third color-mask may include a transmission part which transmits light, a partial transmission part which partially transmits the light and a blocking part which blocks the light. The transmission part is disposed in an area in which the third color pattern CF3 is formed. The partial transmission part is disposed in an area in which the dummy color pattern DP is formed. The blocking part is disposed in areas in which the first and second contact holes C1 and C2 are formed. The partial transmission part may include a halftone mask and a slit mask.

The dummy color pattern DP formed by the partial transmission part of the third color-mask has a thickness less than that of the third color pattern CF3 formed by the transmission part of the third color-mask. The thickness of the dummy color pattern DP may be preset based on the step coverage of the metal layer of the bridge line BL which is disposed on the dummy color pattern DP, and an exposure condition. In one exemplary embodiment, for example, the thickness of the dummy color pattern DP may be less than about 5000 Å.

The first and second contact holes C1 and C2 may be formed in the dummy color pattern DP by the blocking part of the third color-mask.

In one exemplary embodiment, for example, the dummy color pattern DP may be formed from the color photoresist layer corresponding to the last process of the first, second and third color patterns CF1, CF2 and CF3, but is not limited thereto or thereby.

Figure 13D:
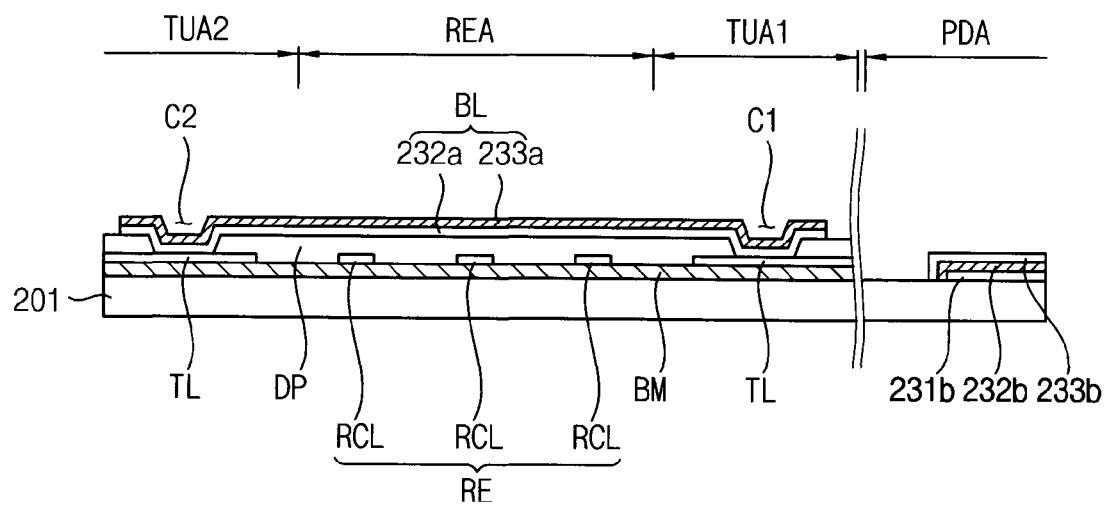
Figure 14D:
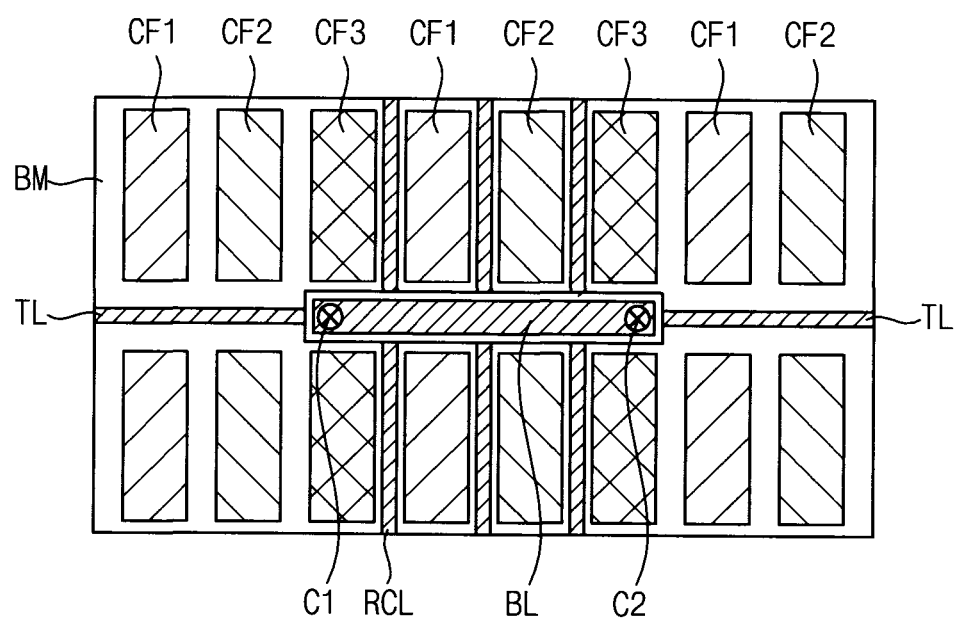

Referring to FIGS. 13D and 14D, a metal layer and a transparent conductive layer are sequentially formed on the second base substrate 201 including the first and second contact holes C1 and C2 defined in the dummy color pattern DP.

The metal layer and the transparent conductive layer are patterned using the same mask to form a metal line 232a and a transparent line 233a of the bridge line BL, and a second metal electrode 232b and a capping electrode 233b of the pad electrode.

The bridge line BL including the metal line 232a and the transparent line 233a is connected to the driving line TL of the first driving unit part TU1 and the driving line TL of the second driving unit part TU2 through the first and second contact holes C1 and C2. The bridge line BL includes the metal line 232a so that the resistance of the bridge line BL may be decreased. In addition, the bridge line BL is formed on the dummy color pattern DP having a relatively thin thickness to reduce or effectively prevent disconnection thereof The second metal electrode 232b and the capping electrode 233b cover an upper surface and a side surface of the pad electrode. That is, the capping electrode 233b may cover the first and second metal electrodes 231b and 232b of the pad electrode so that damage to the pad electrode by moisture in the air may be reduced or effectively prevented.

Figure 13E:
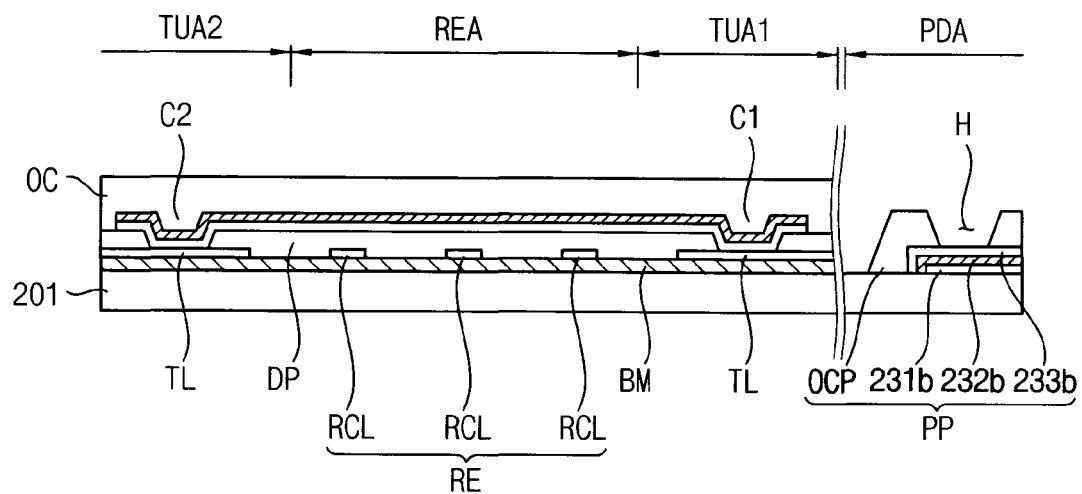

Referring to FIGS. 13E and 14D, the overcoating layer OC is formed on the second base substrate 201 including the bridge line BL and the pad electrode PDE. The overcoating layer OC includes an overcoating pattern OCP formed on the pad electrode 231b and 232b. As shown in FIG. 13E, the overcoating layer OC is disposed on the color filter layer in the active area AA so as to planarize a surface of the color filter layer CFL to be flat or substantially flat. The overcoating pattern OCP includes an opening H defined therein which partially exposes the upper surface of the pad electrode. The overcoating pattern OCP covers a remainder of the upper surface except for the exposed upper surface and the side surface of the capping electrode 233b. The capping electrode 233b is exposed through the opening H so that a terminal of a driving chip may adhere to the pad electrode exposed through the opening H.

According to one or more exemplary embodiment, a mask which is used for forming the color filter layer and/or the overcoating layer, may be modified to form the contact hole defined therein. Thus, a separate mask used for specifically forming the contact hole may be omitted.

According to one or more exemplary embodiment, the bridge line includes the metal line so that the resistance of the bridge line may be decreased. In addition, the capping electrode and the overcoating pattern may reduce or effectively prevent damage to the pad electrode 231b and 232b by moisture in the air. The dummy color pattern DP may have a relatively thin thickness so that disconnection of the bridge line BL may be reduced or effectively prevented.

As described above, according to one or more exemplary embodiment, processes of manufacturing the sensor substrate may be simplified and a reliability of driving the sensor display panel including the sensor substrate may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A sensor substrate comprising:
   a blocking pattern on a base substrate;
   a first electrode on the base substrate and overlapping the blocking pattern, and comprising a plurality of first unit parts arranged in a first direction, each of the first unit parts comprising a plurality of first lines connected to each other in a mesh-type arrangement;
   a color filter layer on the base substrate, and a plurality of contact holes defined in the color filter layer, wherein the contact holes expose the first lines of the first unit parts; and
   a bridge line between and connected to first unit parts adjacent in the first direction, through the contact holes.

2. The sensor substrate of claim 1, further comprising:
   a second electrode on the base substrate and overlapping the blocking pattern, and comprising a plurality of second unit parts arranged in a second direction crossing the first direction, each of the second unit parts comprising a plurality of second lines connected to each other in the mesh-type arrangement; and
   a connection line extended from the second lines and connecting second unit parts adjacent in the second direction to each other.

3. The sensor substrate of claim 2, wherein the bridge line comprises a transparent conductive layer.

4. The sensor substrate of claim 3, further comprising:
   an overcoating layer on the color filter layer, and a plurality of openings defined in the overcoating layer and corresponding to the contact holes defined in the color filter layer,
   wherein the bridge line contacts the first unit parts through the contact holes and is on the overcoating layer.

5. The sensor substrate of claim 3, further comprising:
   a plurality of pads which receives signals which are provided to the first and second electrodes, wherein each of the pads comprises:
   a pad electrode comprising a metal layer; and
   a capping electrode comprising the transparent conductive layer.

6. The sensor substrate of claim 2, wherein the bridge line comprises a metal layer and a transparent conductive layer.

7. The sensor substrate of claim 6, wherein the bridge line contacts a lower surface of the color filter layer, which is adjacent to the contact holes.

8. The sensor substrate of claim 6, wherein
   the blocking pattern defines a pixel area on the base substrate, and
   the color filter layer comprises:
      an island-shaped color pattern on the pixel area; and
      a dummy color pattern in a spacing area between the first unit parts adjacent in the first direction, wherein a thickness of the dummy color pattern is less than a thickness of the island-shaped color pattern.

9. The sensor substrate of claim 8, wherein the bridge line contacts a lower surface of the dummy color pattern, which is adjacent to the contact holes.

10. The sensor substrate of claim 6, further comprising:
    an overcoating layer on the base substrate, wherein the color filter layer and the bridge line are between the overcoating layer and the base substrate.

11. The sensor substrate of claim 10, further comprising:
    a plurality of pads which receives signals which are provided to the first and second electrodes, wherein each of the pads comprises:
    a pad electrode comprising the metal layer and a second metal layer;
    a capping layer covering the pad electrode and comprising the transparent conductive layer; and
    an overcoating pattern on the capping electrode, and an opening defined in the overlapping pattern wherein the opening exposes an upper surface of the capping electrode.

12. A method of manufacturing a sensor substrate, the method comprising:
    providing a blocking pattern on a base substrate;
    providing a first electrode on and overlapping the blocking pattern, the first electrode comprising a plurality of first unit parts arranged in a first direction, each of the first unit parts comprising a plurality of first lines connected to each other in a mesh-type structure;
    providing a color filter layer on the base substrate, and a plurality of contact holes defined in the color filter layer, the contact holes exposing the first lines of the first unit parts; and
    providing a bridge line between and connected to first unit parts adjacent in the first direction, through the contact holes.

13. The method of claim 12, wherein the providing a first electrode comprises:
    providing a second electrode on and overlapping the blocking pattern, the second electrode comprising a plurality of second unit parts arranged in a second direction crossing the first direction, each of the second unit parts comprising a plurality of second lines connected to each other in the mesh-type arrangement,
    wherein second unit parts adjacent in the second direction are connected to each other through the second lines extending in the second direction.

14. The method of claim 13, wherein the bridge line is formed from a transparent conductive layer.

15. The method of claim 14, further comprising:
    providing an overcoating layer on the color filter layer, and a plurality of openings defined in the overcoating layer, wherein the openings correspond to the contact holes defined in the color filter layer,
    wherein the bridge line contacts the first unit parts through the contact holes and is on the overcoating layer.

16. The method of claim 14, further comprising:
    providing a plurality of pads which receives signals which are provided to the first and second electrodes,
    wherein each of the pads comprises a pad electrode formed from a metal layer and a capping electrode formed from the transparent conductive layer.

17. The method of claim 14, wherein the bridge line is formed from a metal layer and the transparent conductive layer.

18. The method of claim 17, wherein the bridge line contacts the first unit parts through the contact holes and contacts a lower surface of the color filter layer, which is adjacent to the contact holes.

19. The method of claim 17, wherein
    the providing a blocking pattern defines a pixel area on the base substrate; and
    the providing the color filter layer comprises:
       providing an island-shaped color filter pattern in the pixel area; and providing a dummy color pattern in a spacing area between the first unit parts adjacent in the first direction,
wherein a thickness of the dummy color pattern is less than a thickness of the color filter pattern.

20. The method of claim 19, wherein the bridge line contacts a lower surface of the dummy color pattern, which is adjacent to the contact holes.

21. The method of claim 17, further comprising:
providing an overcoating layer on the color filter layer and the bridge line, on the base substrate.

22. The method of claim 21, further comprising:
providing a plurality of pads which receive signals which are provided to the first and second electrodes,
wherein each of the pads comprises:
a pad electrode formed from the metal layer and a second metal layer,
a capping electrode formed from the transparent conductive layer and covering the pad electrode, and
an overcoating pattern on the capping electrode, and an opening defined in the overcoating pattern, wherein the opening exposes an upper surface of the capping electrode.

23. A sensing display panel comprising:
a sensor substrate comprising:
a blocking pattern on a first substrate,
a first electrode on the first substrate and overlapping the blocking pattern, the first electrode comprising a plurality of first unit parts arranged in a first direction, each of the first unit parts comprising a plurality of first lines connected to each other in a mesh-type arrangement,
a color filter layer on the first substrate, and a plurality of contact holes defined in the color filter layer, wherein the contact holes expose the first lines of the first unit parts, and
a bridge line connecting first unit parts adjacent to each other in the first direction, through the contact holes; and
a display substrate comprising:
a switching element on a second substrate opposite to the first substrate,
a pixel electrode connected to the switching element, and
a common electrode overlapping the pixel electrode.

24. The sensing display panel of claim 23, wherein the sensor substrate further comprises:
a second electrode on the first substrate and overlapping the blocking pattern, and comprising a plurality of second unit parts arranged in a second direction crossing the first direction, each of the second unit parts comprising a plurality of second lines connected to each other in the mesh-type arrangement; and
a connection line extended from the second lines and connecting second unit parts adjacent in the second direction, to each other.

25. The sensing display panel of claim 24, wherein the bridge line comprises a transparent conductive layer.

26. The sensing display panel of claim 25, wherein the sensor substrate further comprises:
an overcoating layer on the color filter layer, and a plurality of openings defined in the overcoating layer, wherein the openings overlap the contact holes defined in the color filter layer,
wherein the bridge line contacts the first unit parts through the contact holes and is on the overcoating layer.

27. The sensing display panel of claim 25, wherein the sensor substrate further comprises:
a plurality of pads which receives signals which are provided to the first and second electrodes, wherein each of the pads comprises:
a pad electrode comprising a metal layer, and
a capping electrode comprising the transparent conductive layer.

28. The sensing display panel of claim 24, wherein the bridge line comprises a metal layer and a transparent conductive layer.

29. The sensing display panel of claim 28, wherein the bridge line contacts a lower surface of the color filter layer, which is adjacent to the contact holes.

30. The sensing display panel of claim 28, wherein
the blocking pattern defines a pixel area, and
the color filter layer comprises:
an island-shaped color pattern on the pixel area; and
a dummy color pattern in a spacing area between the first unit parts adjacent in the first direction,
wherein a thickness of the dummy color pattern is less than a thickness of the island-shaped color pattern.

31. The sensing display panel of claim 30, wherein the bridge line contacts a lower surface of the dummy color pattern, which is adjacent to the contact holes.

32. The sensing display panel of claim 28, wherein the sensor substrate further comprises an overcoating layer on the first substrate, wherein the color filter layer and the bridge line are between the overcoating layer and the first substrate.

33. The sensing display panel of claim 32, wherein the sensor substrate further comprises:
a plurality of pads which receives signals which are provided to the first and second electrodes, wherein each of the pads comprises:
a pad electrode comprising the metal layer and a second metal layer,
a capping layer covering the pad electrode and comprising the transparent conductive layer, and
an overcoating pattern on the capping electrode, and an opening defined in the overlapping pattern, wherein the opening exposes an upper surface of the capping electrode.

* * * * *